United States Patent [19]
Saif et al.

[11] Patent Number: 5,786,621
[45] Date of Patent: Jul. 28, 1998

[54] MICROELECTROMECHANICAL INTEGRATED MICROLOADING DEVICE

[75] Inventors: Muhammed T. A. Saif; Noel C. MacDonald, both of Ithaca, N.Y.

[73] Assignee: Cornell Research Foundation, Inc., Ithaca, N.Y.

[21] Appl. No.: 670,725

[22] Filed: Jun. 21, 1996

[51] Int. Cl.$^6$ .................... H01L 29/82; H01L 23/58
[52] U.S. Cl. .................... 257/415; 257/48; 257/417; 257/420; 438/14; 438/50; 438/52
[58] Field of Search .................... 257/48, 415, 417, 257/418, 419; 438/52

[56] References Cited

U.S. PATENT DOCUMENTS

| | | | |
|---|---|---|---|
| 5,198,390 | 3/1993 | MacDonald et al. | 437/203 |
| 5,426,070 | 6/1995 | Shaw et al. | 437/203 |
| 5,500,549 | 3/1996 | Takeuchi et al. | 257/415 |
| 5,536,988 | 7/1996 | Zhang et al. | 310/309 |
| 5,563,343 | 10/1996 | Shaw et al. | 73/514.18 |
| 5,598,010 | 1/1997 | Uematsu | 257/48 |

FOREIGN PATENT DOCUMENTS 40 00 496 A1   2/1991   Germany.

OTHER PUBLICATIONS

E.P. Popov, et al., "Mechanics of Materials", Prentice-Hall Inc., 2nd ed., pp. 18–22.

William N. Sharpe, Jr., et al., "A Novel Miniature Tension test Machine", Small Specimen Test Techniques, pp. 386–401.

Enrico Lucon, et al., "Evaluating a Service–Exposed Component's Mechanical Properties by Means of Subsidized and Miniature Specimens", Small Specimen Test Techniques, pp. 311–323.

Shiro Jitsukawa, et al., "Methods and Devices for Small Specimen Testing at the Japan Atomic Energy Research Institute", Small Specimen Test Techniques, pp. 289–307.

Shigetomo Nunomura, et al., "Evaluation of Tensile Properties Using a TEM Disk–Size Specimen", Small Specimen Test Techniques, pp. 256–266.

Motokuni Eto, et al., "Development of a Miniaturized Bulge Test (Small Punch Test) for Post–Irradiation Mechanical Property Evaluation", Small Specimen Test Techniques, pp. 241–255.

Fahmy M. Haggag, "In–Situ Measurements of Mechanical Properties Using Novel Automated Ball Indentation System", Small Specimen Test Techniques, pp. 27–44.

David J. Alexander, "Fracture Toughness Measurements with Subsize Disk Compact Specimens", Small Specimen Test Techniques, pp. 130–142.

*Primary Examiner*—Mahshid D. Saadat
*Assistant Examiner*—Allan R. Wilson
*Attorney, Agent, or Firm*—Jones, Tullar & Cooper, P.C.

[57] ABSTRACT

A novel apparatus and technique or characterizing materials at submicron scale and for characterizing micromechanical devices integrates test specimens with the testing device. The test specimen is a micromechanical structure made of the material to be characterized or may be a device under evaluation. A microloading instrument is a microelectromechanical structure incorporating a stable, planar frame to which is connected a multiplicity of comb-type capacitive actuators. A variable drive voltage applied across the actuator plates selectively moves the frame structure along a longitudinal axis in a controlled fashion. The frame is mounted to a fixed substrate by means of laterally extending spring arms which position the capacitor plates and guide the motion of the frame along the longitudinal axis. The micro loading instrument is calibrated by buckling a long slender beam cofabricated with the instrument. The instrument's small size and vacuum compatibility allow material testing in macroscopic analytical devices, such as TEM to study in-situ the micro-structural changes of the test specimens. The small size of the system allow material testing in chambers with various environment conditions. The single crystal core of each beam has a high aspect ratio with the dielectric and metal layers overhanging the bottom edge of the core by an amount to balance the stresses and strains within the structure to maintain planarity of the beams and thus of the microloading instrument.

12 Claims, 19 Drawing Sheets

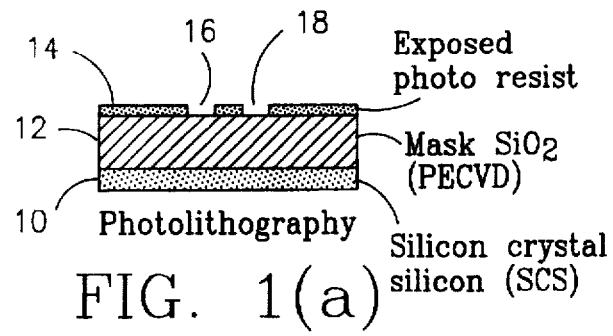
FIG. 1(a) Photolithography
14, 16, 18 — Exposed photo resist
12 — Mask SiO2 (PECVD)
10 — Silicon crystal silicon (SCS)
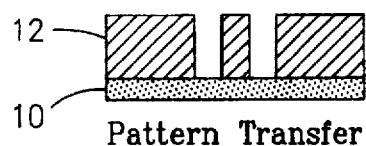
FIG. 1(b) Pattern Transfer
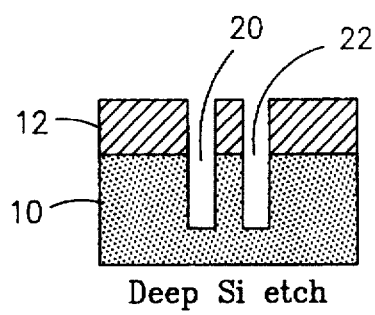
FIG. 1(c) Deep Si etch
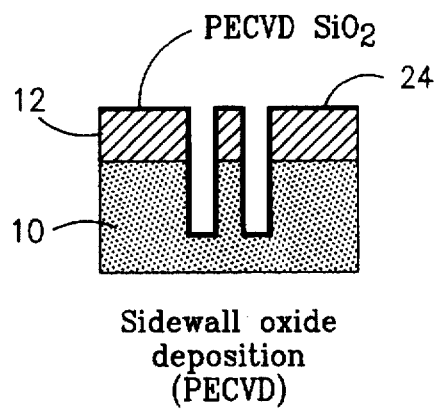
FIG. 1(d) Sidewall oxide deposition (PECVD)
PECVD SiO2
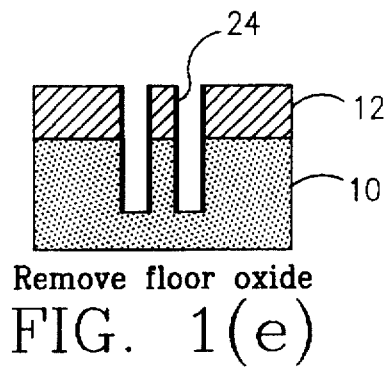
FIG. 1(e) Remove floor oxide
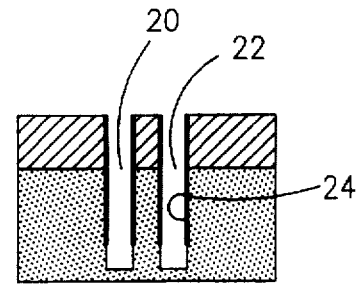
FIG. 1(f) Second Silicon etch
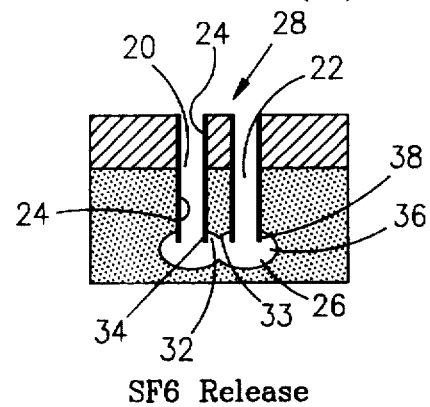
FIG. 1(g) SF6 Release
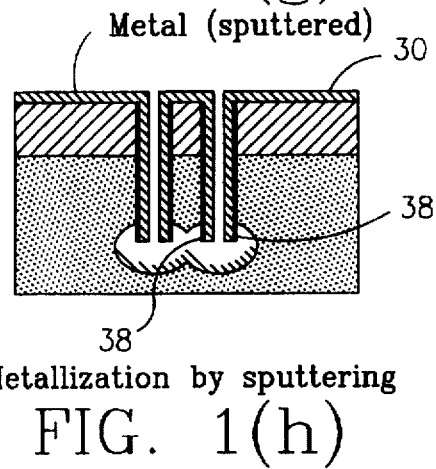
FIG. 1(h) Metallization by sputtering
Metal (sputtered)

b = 1 μm for combs,
= 2 μm for beams and cross bars

MICROELECTROMECHANICAL INTEGRATED MICROLOADING DEVICE

This invention was made with Government support under Grant No. DABT63-92-C0019, awarded by the Advanced Research Projects Agency (DARPA). The Government has certain rights in the invention.

BACKGROUND OF THE INVENTION

This application claims the benefit of U.S. Provisional Application No. 60/000,438, filed Jun. 23, 1995, the disclosure of which is hereby incorporated herein by reference The present invention relates, in general, to a microelectromechanical instrument for mechanical and electrical characterization of submicron scale structures and materials and, more particularly, to a microelectromechanical device for generating compressive or tensile forces on samples for use in testing materials and structures such as submicron beams.

Material characterization at submicron scale is of interest to a wide variety of disciplines including materials science, MEMS design, and the micro electronics industry. For example, in order to facilitate the design of micromechanical structural components, the materials from which they are made must be known, the various forces to which such structures are subject must be identified, and the response of such structures to controlled loads must be known. Thus, various characteristics such as resonant frequency, damping and deformation under various loading conditions, the effects of vacuum, temperature, and humidity, as well as the strength, fracture and fatigue properties of the material, must be evaluated. Not only is the characterization of mechanical and electrical properties of materials essential for effective design of MEM systems so as to permit reliable industrial use, but the characterization of representative devices from a batch in a production line is important to ensure quality control.

In the macroscopic world, materials testing machines are manufactured independently of the samples to be tested, with the samples being designed and fabricated to conform with the loading machine. Attachments must be designed and fabricated for gripping the sample with the loading device and special effort is needed for proper alignment of the test samples. These factors limit the variation of the test sample as well as the application of the loading devices.

When the microscopic world is entered, macro tools and machines become unusable, for everything is too small to be compatible with conventional equipment. Accordingly, there is no way, at the present time, to verify that material parameters measured in a macro scale are still true at a micro scale. For example, microstructural analysis of the sample cannot be carried out during testing, simply because the testing machines are too large to be coupled with analytical devices such a TEM. Such analysis is done after the testing is complete and hence the analysis reveals only the final state of the microstructure, not the evolution of the final state during testing.

The provision of a micro-mechanical device for material characterization not only makes the testing of submicron scale samples possible, but also permits in-situ microstructure study of the sample because the entire size of the device with the sample is only few millimeters. Furthermore, the small size allows testing in chambers with various environmental conditions, such as different temperatures and humidity conditions. Different types of characterization, both mechanical and electrical, with integrated micro loading devices are possible.

Micromechanical loading devices for material characterization must be designed on the basis of the specific test they are going to perform. Some tests may require large stress, and hence a large force must be generated. Note that the large force is still very small (e.g., a milliNewton) compared to the forces used in the macroscopic world. The large force requirement can be realized by microelectro-mechanical (MEM) devices that are large (e.g., a few mm), but incorporate micron-size features. Large MEM devices may act as large force actuators and at the same time sense small displacements or strains of test samples during testing due to large changes of capacitance due to the displacements. Aside from microloading device applications, large MEMs can also be used for fabricating information storage or surface analysis devices utilizing large x-y-z movable stages carrying arrays of micro-sensors, tunneling tips or emitter tips.

For reliable performance, large MEM devices must satisfy certain stringent requirements. For example, they must be highly planar, must be very stiff in order to resist undesirable motion such as, for example, out of plane motion, and must be sufficiently strong to resist damage that might be caused by wet and dry processes used for fabricating other integrated devices on a common substrate, for example.

The Single Crystal Reactive Etching and Metallization (SCREAM) process as described, for example, in U.S. Pat. No. 5,316,979, in copending U.S. application Ser. No. 08/312,797, filed Sep. 27, 1994 of Kevin A. Shaw et al., or the related SCREAM-I process described in U.S. Pat. No. 5,426,070, the disclosures of which are hereby incorporated herein by reference, permit fabrication of micron-scale high aspect ratio structures such as released beams having widths as low as 0.2 micrometers and depths as high as 100 micrometers, and having minimum gaps between adjacent beams as small as 0.2 micrometers. Such SCREAM structures can be fabricated to achieve very low to very high out-of-plane stiffness by varying the aspect ratio and the length of the structure, and can be fabricated to have a high lateral stiffness, as by the design of ladder-type beams. Small gaps between features allow electrical actuation of such devices by the use of capacitive effects. Furthermore, since these processes utilize single crystal silicon substrates, structures manufactured by this process have predictable mechanical and electrical properties, as compared to polysilicon structures, and are easily integratable with other onchip devices.

A typical cross section of a beam or similar structure fabricated utilizing the SCREAM process consists of a single crystal silicon (SCS) core coated by a thin silicon dioxide ($SiO_2$) or nitride dielectric layer, with the dielectric layer being covered with metal, so that the beams are composite in nature. The dielectric and metal coatings on the SCS core are formed at different temperatures so that thermal as well as intrinsic stresses build up in the beams, and such stresses often result in out-of-plane deformation upon release of the beam structure, producing nonplanar structures. Such deformation is negligible for structures having dimensions on the order of a few hundred microns, but for structures several millimeters in size, non-planarity may interfere with structural performance and reliability. One part of this invention is the finding that large planar MEMs can indeed be fabricated by the SCREAM process. The corresponding design recipe will be detailed below.

An important feature of the microloading device is the calibration of the load that it applies on the test sample. In macroscopic loading machines, the calibration is done by commercially available load cells. The micromechanical loading machines disclosed herein are equipped with a load calibrating mechanism, which relies on buckling of long slender beams. The methodology of load calibration is part of the present invention and the principle of load calibration by buckling will be explained hereinafter.

Another important feature is the ability of the present invention to provide material characterization using a microelectromechanical device in combination with a macroscopic analytical instrument such as a scanning electron microscope (SEM) or a transmission electron microscope (TEM) to allow submicron material testing in-situ.

SUMMARY OF THE INVENTION

In accordance with the present invention, a method and apparatus are provided for submicron scale material characterization for both mechanical and electrical properties. The material being tested can be the material used in making MEM structures. The results of such characterization permit controlled fabrication of MEM structures to provide desired features and properties, and accordingly the invention is also directed to the fabrication of MEM released beam structures having selected characteristics.

The apparatus of the invention includes a microelectromechanical loading device that can generate tensile or compressive force on a test sample. At the micro scale of the invention, the forces per unit can be very high; for example, as high as 100 milliNewtons. The device may span up to a few mm on each side.

Such a loading instrument incorporates an actuator fabricated from an array of MEM beam structures and is capable of generating compressive or tensile forces on test samples. The instrument permits the study of material strength in submicron structures, including fracture and fatigue properties, to a stress level of greater than 100 GPa on a 100 nm by 100 nm test specimen. The instrument preferably is fabricated using the SCREAM process, and the force which it generates is obtained by electrically actuating a set of actuator drivers such as high aspect ratio comb capacitors or parallel plate capacitors which are fabricated as a part of the instrument.

In order to overcome the prior art problems involved in fastening submicron test samples to test instruments, in accordance with the invention, test samples may be patterned and fabricated as an integral part of the loading instrument. Such test samples may include 20 nm diameter tips, composite beams of thin films, thin film plates of, for example, polysilicon, and other complex micromechanical structures. If, however, the test sample cannot be cofabricated with the loading device and must be fabricated separately, then the sample can be transported to the site of testing by other conventional micromovers or by micromanipulation.

The MEM instrument of the invention is small in size (a few mm), has a low thermal mass, is compatible with vacuum environments, and incorporates built-in vibration isolation to allow material characterization to be performed over a wide range of environmental conditions, including high vacuum such as may be used in electron microscopy and surface analysis, high humidity, high pressure and high or low temperatures. The instrument can generate a wide range of forces, from forces on the order of a microNewton ($\mu N$) to a Newton, utilizing electrostatic or capacitive (with parallel plate or comb capacitors) force generators. Furthermore, the use of capacitive force generators permits detection of the response of the material to the applied force by measuring changes in actuator capacitance.

Once fabrication of the instrument and the integral test sample is complete, the instrument is actuated to generate a tensile or compressive load on the test sample. The load can be quasistatic; i.e., can vary slowly in time in either tension or compression, or it can be dynamic, as with rapid cyclic loading. When the test sample is deformed by the forces applied to it, either by stretching, compressing or buckling, the loading device moves accordingly. This movement can be traced from the change of capacitance in the actuator, so that the device not only applies force, but serves as a sensor. Thus, the loading device and test sample form a complete, integrated microloading instrument.

In one form of the invention, a microelectromechanical loading instrument consists of a rigid, elongated backbone, or trunk, which is supported for motion with respect to a relatively fixed substrate along an axis. The trunk is supported with respect to the substrate by a plurality of flexible spring arms, or limbs, extending laterally from the trunk and connected to supports on the substrate. The trunk also carries a plurality of cantilevered, laterally-extending wings which, in turn, support comb structures which are movable with the trunk and which include multiple fingers which extend in a direction parallel to the axis of the trunk. Corresponding fixed comb structures are mounted on the substrate, as by suitable mounting arms, with the fixed comb structures having fingers which also extend in a direction parallel to the axis of the trunk and which are interleaved with the movable comb fingers are laterally spaced so that adjacent movable and fixed fingers form opposed capacitor plates.

The loading instrument preferably is fabricated in a single crystal silicon substrate using the SCREAM process described above, whereby the movable structure consists of an array of released single crystal silicon beams supported within a cavity in the substrate for relative motion with respect to the substrate. The movable structure preferably consists of single crystal silicon beams carrying a dielectric layer such as silicon dioxide, with the dioxide layer being covered by a thin metal layer, the metal layer on the interleaved fingers providing conductive capacitor plates across which selected potentials are applied to produce controlled motion of the trunk with respect to the substrate. The metal layer may be patterned and electrically connected to a variable source of bias to provide a drive voltage for the capacitive plates, and connected to suitable sensing circuits for detecting changes in capacitance to measure the motion of the instrument.

In one embodiment of the invention, the trunk is fabricated integrally with one end of a sample structure which is to be tested. The sample may be a thin, elongated beam having its opposite end integral with the substrate. The beam preferably is fabricated at the same time the trunk is fabricated, using the SCREAM process, so that it is connected to the instrument in proper alignment with its axis. In this way, axial motion of the trunk applies tension or compression to the beam under the control of the drive voltage.

In general, in a microloading instrument force is generated by applying voltage between parallel plate or comb capacitors, or both. The movable capacitors of the instrument are held by released beams that act as springs. With the application of voltage the instrument applies force on the test sample and deforms it. As a result, the springs holding the capacitors also deform and share a part of the force generated by the capacitors. Thus, in order to accurately determine the force applied on the test sample, one needs to know (a) how much force, F, is generated by the capacitors due to the known applied voltage, V, and (b) the spring constant, K, of the device.

If the movable part of a loading instrument, that generates force by employing comb capacitors only, moves by amount $\delta$, then the deformation of the test sample is also $\delta$, and so is the deformation of the springs. The force shared by the springs is $K\delta$. The force F is proportional to $V^2$; i.e., $F=\beta V^2$ where $\delta$ needs to be determined for the loading device. Once $\beta$ and K are known, then the force applied on the test sample can be found from:

$$F - K\delta = \beta V_2 - K\delta \quad \text{(Eq. 1)}$$

For macroscopic machines, the load applied on the sample is calibrated by a load cell. In the case of a micro loading instrument, the two parameters, $\beta$ and K can be obtained by buckling a long slender beam. For calibration purposes, the loading device of the invention applies force to such a beam, so there is no other test sample.

The loading instrument applies an axial compressive force on the sample beam. The beam buckles when the applied force exceeds a critical value.

$$P_{cr} = \frac{c\Pi^2 EI}{L^2} \quad \text{(Eq. 1)}$$

where EI is the minimum flexural rigidity of the cross-section of the beam, L is the length of the beam, and C is a constant that depends on the end boundary conditions. For example, if the beam is clamped at both ends, $C \approx 4$; if it is clamped at one end and hinged at the other, $C' \approx 2$. If the beam is made of one material, and its cross section is rectangular, then:

$$I = \frac{bh^3}{12} \quad \text{(Eq. 2)}$$

where b and h are the two dimensions of the section, h being the smaller. E is the modulus of elasticity of the material. If the beam is composite; i.e., the cross section is made of several materials, then the flexural rigidity k is:

$$k = \sum_{i=1}^{N} E_i I_i \quad \text{(Eq. 3)}$$

where $E_i I_i$ is the rigidity of material i, and N is the number of materials forming the beam. In this case, k must be used instead of EI in Eq. 1.

One choice of the buckling beam would be a beam with both ends clamped, where one end is attached to a fixed support and the other to the loading instrument. As the instrument applies axial compressive force on the beam and the force exceeds the critical load to buckle $P_{cr}$, then the beam buckles. After buckling, the beam takes negligible additional force. As it buckles, its end moves by an amount $\delta$, and it deforms transversely. The maximum transverse deformation, $\Delta$, is at the mid length of the beam and is related to $\delta$ by:

$$\Delta = \frac{2}{\pi} \sqrt{L\delta} \quad \text{(Eq. 4)}$$

as long as $\Delta$ is within 10% of L. For a 500 µm long beam, $\Delta$=20 µm will be sufficient to calibrate the loading instrument. Thus, $\Delta$ can easily be measured by an optical microscope or by an SEM (scanning electron microscope). From the experimentally measured $\Delta$, the end displacement $\delta$ can be calculated from:

$$\delta = \Delta^2 \left( \frac{\pi}{2} \right)^2 / L \quad \text{(Eq. 5)}$$

From the experimentally measured values of applied voltages on the loading actuator and the corresponding values of $\delta$, a best fit curve can be obtained, given by $$V^2 = a\delta + b \quad \text{(Eq. 6)}$$

where a and b are the slope and intercepts of the best fit straight line. The force generated by the device is shared by the buckling beam and the springs of the loading instrument, since no test sample is attached at this time. Thus:

$$F = \beta V^2 = K\delta + P_{cr} \quad \text{(Eq. 7)}$$

From the cross-sectional geometry of the buckling beam, $P_{cr}$ is determined. Dividing Eq. 7 by $\beta$ gives:

$$V^2 = \frac{K}{\beta} \delta + \frac{P_{cr}}{\beta} \quad \text{(Eq. 8)}$$

From a comparison between Eq. 6 and Eq. 8:

$$a = \frac{K}{\beta} \text{ and } b = \frac{P_{cr}}{\beta}$$

Thus, from the known values of a and b from Eq. 6 and 8 obtained experimentally, the values $$\beta = \frac{P_{cr}}{b} \text{ and } K = a\beta$$

can be determined. This completes the calibration of the loading instrument.

If the value of $\delta$ is sufficiently large, the springs of the loading instruments become non-linear, in which case Eq. 7 must be modified as follows:

$$F=\beta V^2=K\delta+K_1\delta^3+K_2\delta^5+\ldots+P_{cr} \quad \text{(Eq. 9)}$$

where $k_1$, $k_2$, etc. are the higher order stiffness terms of the springs. In that case, Eq. 6 will not represent the experimental relationship between the observed values of V and $\delta$. In other words, a linear relation between $V^2$ and $\delta$ will deviate from their actual nonlinear relation. Thus, Eq. 6 must also be modified to:

$$V^2 a \delta+a_1\delta^3+a_2\delta^5+\ldots+b \quad \text{(Eq. 10)}$$

where a, $a_1$, $a_2$ and b can be obtained from the best fit curve through the experimental plot of $V^2$ versus $\delta$. Comparing Equations 9 and 10 provides:

$$a = \frac{K}{\beta} \; ; a_1 = \frac{k_1}{\beta} \; ; a_2 = \frac{k_2}{\beta} \ldots \text{and } b = \frac{P_{cr}}{\beta}$$

the last of which gives $\beta=P_{cr}/b$. From the rest we get k, $k_1$, $k_2$. Thus, even if the springs of the loading instrument behave non-linearly due to a large value of $\delta$, the proposed method can calibrate the loading instrument.

The above method of calibrating the loading actuator is part of the invention. Note that the calibrating buckling beam is also patterned and fabricated with the loading device. This cofabrication of the calibrating mechanism with the loading device, in addition to the cofabrication of the test samples, result in the integrated testing system of the invention. Furthermore, the system's small size allows its integration with macroscopic analytical instruments which includes optical and electron microscopy, transmission electron microscopy, x-ray analysis, and Auger electron spectroscopy, just to name a few.

It should be noted that the design of integrated microloading devices will depend on the specifics of the material being tested, the type of microstructural analysis during testing, the fabrication of the test samples, and the environment of testing (for example, temperature and humidity conditions). The design must account for stability of the instrument during fabrication, testing, and handling, the force required, and the relative stiffness of the test sample and the springs of the loading instrument. Such considerations are conventional and are routinely applied for macroscopic devices where force is generated. The design consideration that is particularly of interest for the micromechanical device is the issue of planarity. The reason is, depending on the specific testing, a micro loading device may be large (a few mm), but made of small features on the order of a micrometer, preferably fabricated using the SCREAM process.

Large microelectromechanical systems fabricated by the SCREAM process incorporate narrow and deep structural beams having high aspect ratios (5–100) which are selected for out-of-plane stability. As noted above, when thin films of a dielectric material such as silicon dioxide or nitride, as well as of metal, are deposited or grown on a single crystal silicon core, thermal stresses develop since the thermal coefficients of expansion of the films and the single crystal silicon are different from each other. If the films are deposited at temperatures lower than their flow temperatures, then intrinsic stresses develop as well, and these, together with the thermal stresses, tend to deform the beams out of plane. By measuring the characteristics of such beams in accordance with the present invention, it is found that the foregoing stresses may cause the beam to bend up or down, or remain straight, depending on the beam cross sectional dimensions.

The thin dielectric and metal films which are on the single crystal silicon core cover the top and side walls of the core and overhang the bottom of the core at the side walls. It has been found, in accordance with the present invention, that out-of-plane deformation of the beam due to stresses in the films on the top of the core can be compensated by the amount of overhang of the coatings at the side walls. The silicon dioxide layer on the single crystal silicon core has a positive intrinsic strain, and tends to stretch when confined. Thus, the silicon dioxide on the top wall of the beam tends to stretch that surface of the beam and to bend the beam downwardly, which may be termed a positive bend. Similarly, oxide on the overhang also tends to stretch, and consequently tends to bend the beam upwardly, to produce a negative bend. If the beam is constructed so that the two bending effects cancel, the beam remains planar; otherwise, the beam bends upwardly or downwardly. This bending is a unique feature of SCREAM beams, and a part of the present invention is in designing SCREAM beams to remain planar, even in large arrays of beams.

It is noted that the fabrication of micro loading devices is not limited to the SCREAM process. Any process that allows fabrication of released components held by springs, and generation of force, whether electrostatically, thermally or magnetically, can be employed to develop integrated microloading devices.

BRIEF DESCRIPTION OF THE DRAWINGS

The foregoing, and additional objects, features and advantages of the present invention will become apparent from the following detailed description of preferred embodiments, taken in conjunction with the accompanying drawings in which:

FIGS. 1(a)–(h) illustrate the SCREAM process for fabricating the microelectromechanical (MEM) structures of the present invention;

DESCRIPTION OF PREFERRED EMBODIMENTS

Figure 2:
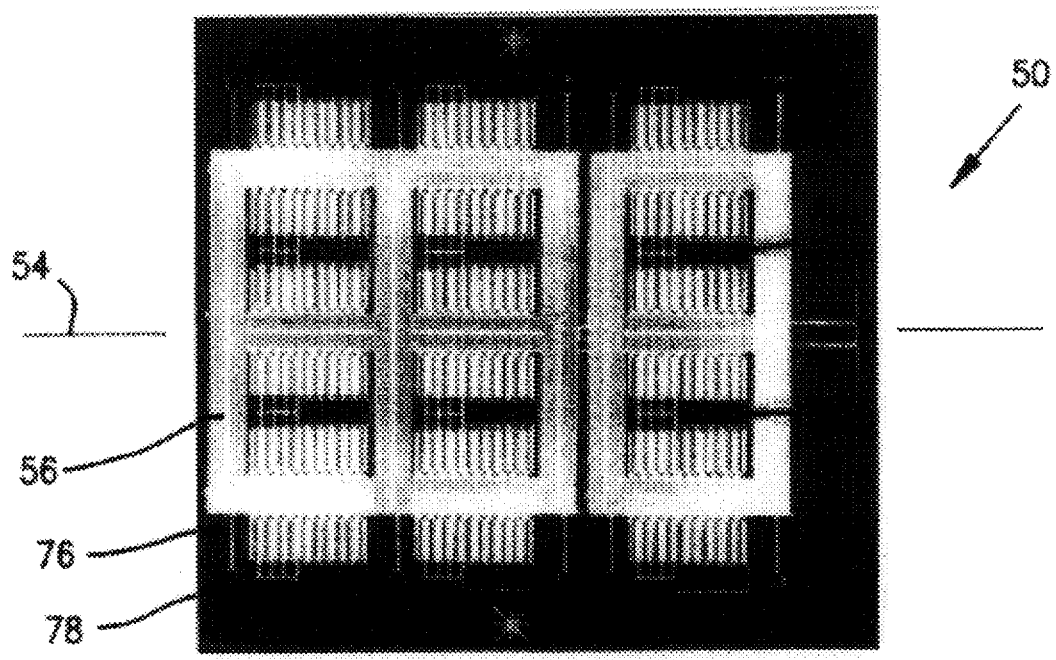
FIG. 2 is a top plan view photograph of a loading instrument constructed in accordance with the invention.

FIGS. 1(a) through (h) illustrate in diagrammatic form the process steps for Single Crystal Reactive Etching and Metallization (SCREAM) as described in U.S. Pat. No. 5,316,979. As illustrated, in accordance with this process a top surface of a single crystal silicon substrate 10 is covered by a masking layer 12 of PECVD silicon dioxide. A photoresist layer 14 is applied and exposed to provide a pattern to define the shape of the structure which is to be fabricated. In this example, the pattern is a pair of parallel paths 16 and 18 which are provided in the layer 14 to define the shape and location of an elongated released beam.

As illustrated in FIG. 1(b) the photoresist pattern is transferred to the mask layer 12 and thereafter a deep silicon etch produces trenches 20 and 22 in the substrate 10 (FIG. 1(c)).

Thereafter, a layer 24 of oxide is deposited on the trench walls and floors (FIG. 1(d)) by a PECVD deposition of silicon dioxide, and the floor oxide is then removed (FIG. 1(e)), leaving the oxide layer 24 on the side walls of the trench. Following this step, a second silicon etch at the floor of trenches 20 and 22 deepens the trenches (FIG. 1(f)), and this is followed by an $SF_6$ release etch (FIG. 1(g)) as indicated at 26. This release etch extends under the beam portion 28 defined by the parallel trenches 20 and 22 to release the beam from the substrate. Thereafter, the beam and the surrounding substrate is coated by a metal layer 30 (FIG. 1(h)), the metallization extending across the tops of the substrate and beam and extending down both side walls of the trenches.

As illustrated in FIG. 1(g), the release etch extends under the beam portion and upwardly behind the oxide layer 24 on the beam walls to produce a cavity 32 under the beam, thereby leaving the side wall oxide layer 24 extending downwardly, or overhanging, the bottom surface 33 of the released beam, as illustrated at 34. In similar manner, the etch step produces cavities 36 in the substrate side wall behind the side wall oxide layer 24, producing an overhanging region 38 on the substrate side wall. As illustrated in FIG. 1(h), the metal layer 30 completely covers the side wall oxide 24, extending onto the overhang regions 34 and 38.

Figure 3:
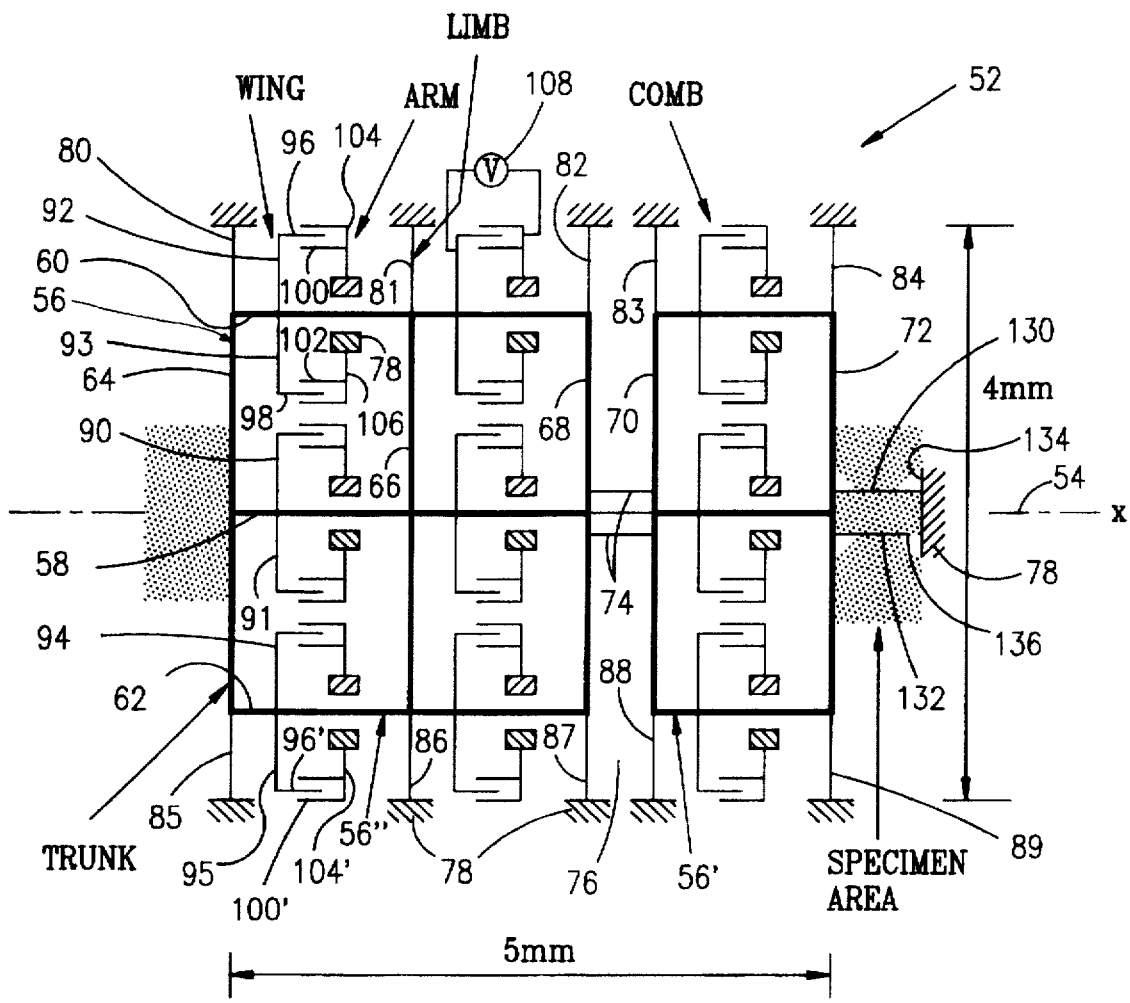
FIG. 3 is a diagrammatic illustration of the device of FIG. 2.

A microloading instrument fabricated utilizing the SCREAM process described above is illustrated at 50 in FIG. 2 and in diagrammatic form at 52 in FIG. 3. In its illustrated embodiment, the device 50 has a longitudinal length of about 5 millimeters along its longitudinal axis 54, has a transverse width perpendicular to axis 54 of about 4 millimeters, and is about 12 micrometers deep. As more clearly illustrated at 52 in FIG. 3, the device consists of a frame, or trunk 56 which includes a central, or axial, frame element, or backbone, 58 and a pair spaced parallel side frame elements 60 and 62 joined to the central frame element by lateral connector frame elements 64, 66, 68, 70 and 72. These interconnected frame elements form forward and rearward trunk portions 56' and 56" interconnected by a plurality of rigid axial beams 74.

The frame 56 is fabricated from multiple released (SCREAM) beams and thus is located within a cavity 76 produced by trenches formed in a substrate 78 of, for example, single crystal silicon. The frame 56 is supported for motion within the cavity 76 by a plurality of flexible beams, or limbs 80–89 extending between the side frame elements 60 and 62 and corresponding fixed locations on the substrate 78.

The frame 56 supports a plurality of transversely extending wings such as those illustrated at 90, 91; 92, 93; and 94, 95 supported by the axial frame elements 58, 60 and 62, respectively. Each of the wings 90–95 carries one or more comb portions, such as the comb portions 96 and 98 on wings 92 and 93, for example, which are movable with the frame in a direction parallel to axis 54. The comb portions 96 and 98 each consist of a multiplicity of axially extending fingers which are movable longitudinally, parallel to axis 54, with motion of the frame 56. Interleaved with the finger portions of each of the combs 96 and 98 are corresponding fingers on fixed comb portions 100 and 102, respectively, mounted on the substrate by corresponding arms 104 and 106, respectively, which may be cantilevered from the substrate 78. Additional wings and corresponding comb devices are spaced along the frame elements 58, 60 and 62.

Although FIG. 3 illustrates the loading instrument in simplified diagrammatic form, it should be understood that in one embodiment of the invention each of the frame elements 58, 60, 62, 64, 66, 68, 70 and 72 consists of 30 parallel elongated beams each approximately 2 micrometers wide and several millimeters long, the beams being spaced 10 micrometers center to center, with the parallel beams being interconnected in a ladder structure by spaced cross bars to provide rigidity. Each of the limbs 80–89 may similarly be constructed of multiple (in this embodiment, two) parallel beams 500 micrometers long, spaced 10 micrometers center to center, and interconnected by cross bars for increased rigidity. The wings 92 and 93 may each be 400 micrometers long, while the arms 104 and 106 may each be 355 micrometers long. Each of the arms and wings consist of, for example, two parallel beams with cross bars, and the arms and wings may be parallel to each other and spaced apart by, for example, 22.5 micrometers. The fingers on the movable and fixed combs 96 and 100, for example, are each 15 micrometers long, with the fingers on the movable comb being spaced at 7 micrometer intervals and the fingers on the fixed comb also being spaced at 7 micrometer intervals. The fingers are interleaved and overlapping by about 7 micrometers. After fabrication, the gap between adjacent fingers of the fixed and movable combs is nominally 1.5 micrometers.

Figure 4:
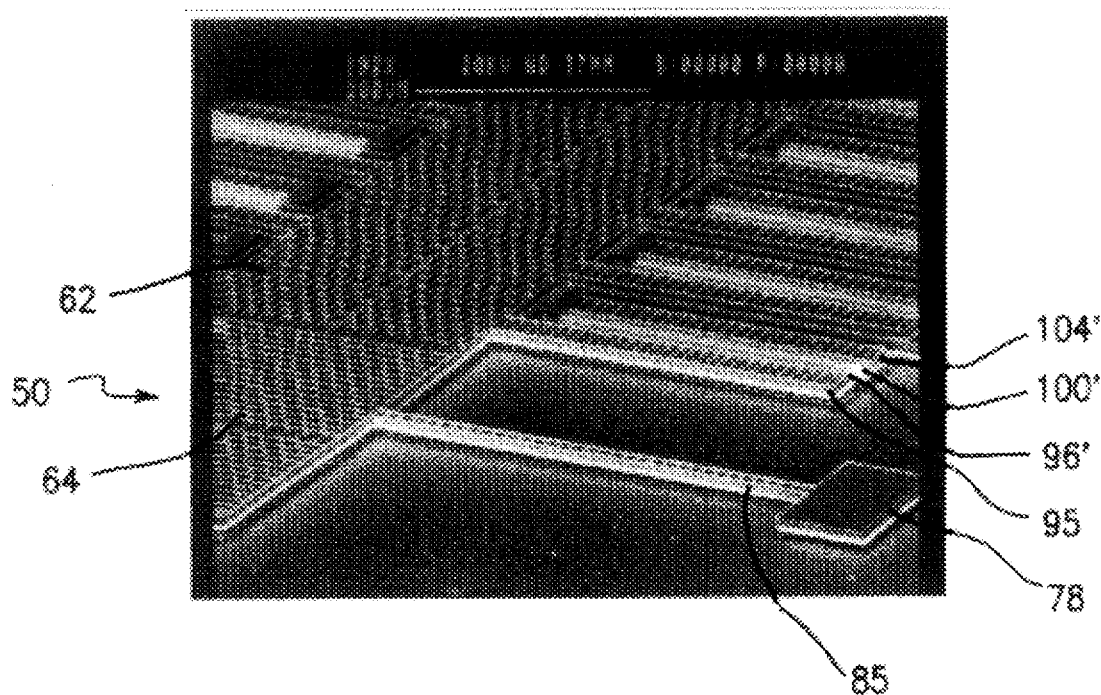
FIG. 4 is an enlarged perspective view of a first portion of the device of FIG. 2, showing trunk and limb portions thereof.

FIG. 4 is an enlarged perspective view of the lower left hand corner of the microloading device 50 as viewed in FIG. 2, illustrating the longitudinal side frame element 62 and the cross frame element 64 of the frame, or trunk, 56. As illustrated, each of these frame elements is made up of a multiplicity of spaced parallel beams connected by cross bars. Also, as illustrated in FIG. 4, the supporting limb 85 is constructed of a pair of spaced parallel beams interconnected by cross beams, as is the wing 95 and the corresponding arm 104'. The wing and arm portions support corresponding comb structures 96' and 100' which incorporate a multiplicity of interleaved capacitor fingers.

Figure 5:
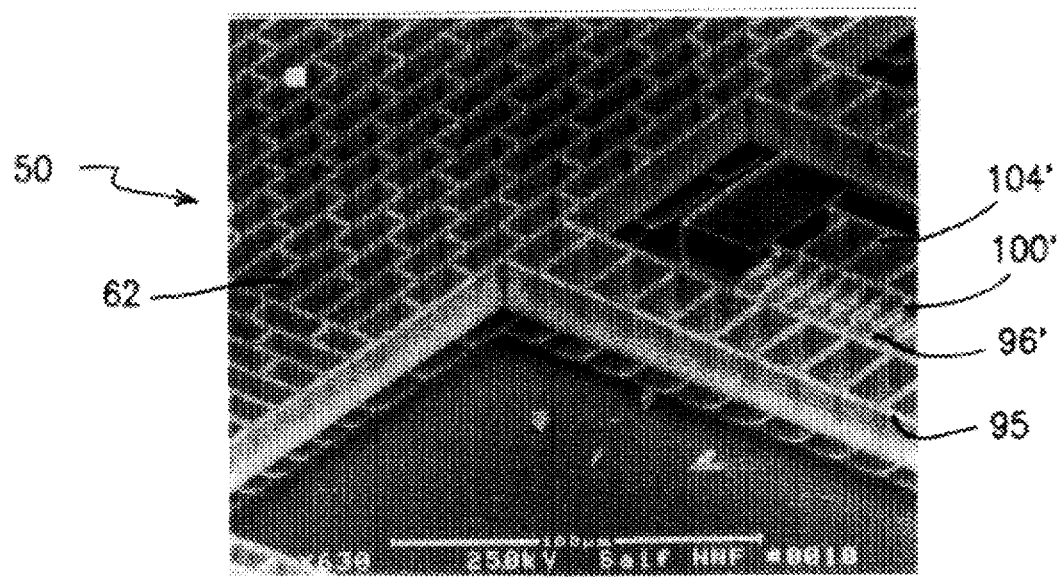
FIG. 5 is an enlarged view of a second portion of the device of FIG. 2, showing wing, arm and comb portions thereof.

FIG. 5 is a further enlarged view of the microloading instrument 50, showing in greater detail the frame element 62, a wing 95, an arm 104' and the interleaved capacitor fingers 96' and 100'. In the embodiment of FIGS. 2, 4 and 5, all of the beams and cross bars have the same nominal cross section, and all include a single crystal silicon core having a width of 2 micrometers. The comb fingers 96' and 100' have similar cross sections, but with the core width being about 1 micrometer. In the illustrated instrument the array of beam supports, includes 9000 movable comb fingers.

When a bias, or drive voltage or potential, V is applied between the fixed and movable fingers 96' and 100' of the multiple combs connected to trunk 56 as illustrated at 108 in FIG. 3, the force generated by the potential difference between adjacent fingers causes the trunk to shift laterally along the axis 54. The limbs 80–89 restrict the motion to a linear path, maintain the trunk in a common plane, and maintain the even spacing between fingers as the trunk moves. The motion along the axis 54 may be referred to as motion along an x axis, with the translation of the trunk due to the applied force being $\Delta x$. The force generated by each movable comb during electrical actuation, $f_{act}$, is given by $$f_{act} = \epsilon_0 \frac{h}{d} V^2 = 7.08 \times 10^{-11} V^2 \text{ Newton} \quad \text{(Eq. 11)}$$

where the permitivity constant $\epsilon_0 = 8.85 \times 10^{-12}$ F/m, the height h of the comb is 12 µm, the gap d between the movable and the fixed combs is 1.5 µm, and V is the bias between them. The total force due to 9000 combs is $9000 F_{act} = 6.37 \times 10^{-7} V^2$ N. Accordingly, the device of FIG. 2 generates about 1.5 mN force at 50 V.

Motion of the trunk due to the bias voltage V causes the interleaved fingers to move and to change the amount of overlap, thereby changing the capacitance between adjacent fingers. The change of capacitance, $\Delta c$, due to the $\Delta x$ approach of a movable comb finger towards two fixed comb fingers is given by $$\Delta c = 2\epsilon_0 \frac{h \Delta x}{d} \quad \text{(Eq. 12)}$$

The total change of capacitance from 9000 movable combs due to a translation $\Delta x = 1$ µm of the trunk is 1.4 pF. Thus, by sensing a capacitance change of 0.001 pF, one can measure a displacement of less than 1 nm of the trunk.

The motion of trunk 56 causes the limbs 80–89 to flex, or bend, in the plane of motion. The flexural rigidity of each limb, $$k_{limb}^{(V)} = \Sigma E_i I_i \quad \text{(Eq. 13)}$$

about its vertical centroidal axis is found to be $1.64 \times 10^{-10}$ Nm². Here $E_i$ and $I_i$ are the modulus of elasticity and the moment of inertia of material i. The material, in the preferred embodiment of the invention, is single crystal silicon (SCS) with coatings of silicon dioxide ($SiO_2$) and aluminum (Al). The spring constant of each limb of length $L_{limb}$ is $$12 k_{limb}^{(V)} / L_{limb}^3 = 15.72 \text{ N/m} \quad \text{(Eq. 14)}$$

and the total spring constant due to 10 limbs is 157.2 N/m where $E_{scs} = 130$ GPa ((100) orientation), $E_{SiO_2} = 70$ GPa, and $E_{Al} = 70$ GPa. In general, material characterization utilizing the present device will involve a large force on the test specimen with a small overall deformation. Thus, the deformation of the limbs will be small and they will share a small portion of the total load generated.

The total mass of the trunk, the wings and the movable combs is estimated from the material densities:

$$\rho_{SCS} = 2328 \times 10^{-18} \text{ kg/µm}^3 \quad \text{(Eq. 15)}$$

$$\rho_{sio} = 2300 \times 10^{-18} \text{ kg/µm}^3 \quad \text{(Eq. 16)}$$

$$\rho_{Al} = 2700 \times 10^{-18} \text{ kg/µm}^3 \quad \text{(Eq. 17)}$$

and from the cross sectional dimensions of the beams and combs. In the test device of FIG. 2, the total mass was found to be $10.54 \times 10^{-8}$ kg and the resonant frequency was 6.1 KHz. Note that the frequency can be easily increased by increasing the stiffness of the limbs.

Figure 6:
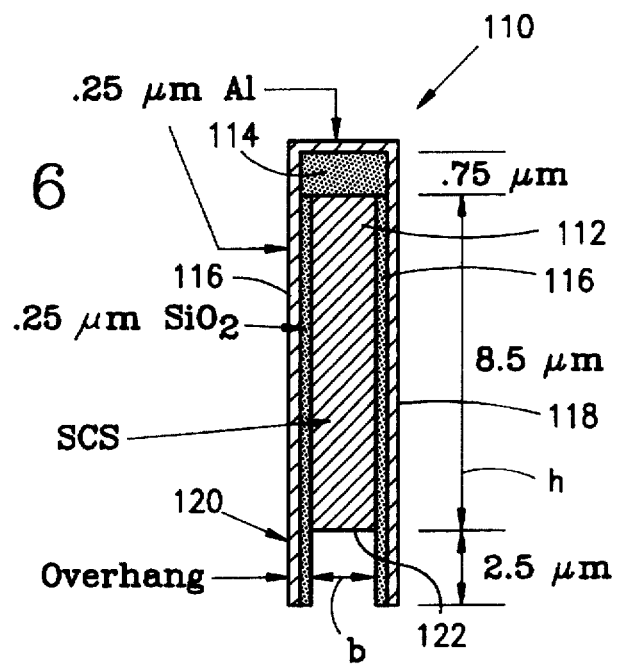
FIG. 6 is a cross-section of a typical beam in the array of beams which make up the device of FIG. 2.

FIG. 6 illustrates a typical cross section of beams which are designed for the micro loading instrument 50 of the present invention and fabricated by the SCREAM process. The beam 110 includes a core 112 which is fabricated from a single crystal silicon (SCS) substrate in the manner described with respect to FIGS. 1(a)–1(h) and which has a cross-sectional width of between about 0.2 and 5.0 µm, and a height of between about 2 and 100 µm. In one example, the beam had a width of 2.0 µm and a height of 12 µm to provide a height-to-width aspect ratio of about 6 to 1. The top and side walls of the core 112 are covered by layers 114 and 116, respectively, of a dielectric such as silicon dioxide. This dielectric layer is, in turn, covered by a thin layer 118 of metal such as aluminum. The layer 114 is about 0.75 µm thick, and the side wall layers 116 and the Al layer 118 are each approximately 0.25 micrometers thick. The release process described with respect to FIG. 1(g) produces an overhang 120 wherein the layers 116 and 118 extend below the bottom wall 122 of the core 112 by an amount which is selected, in accordance with the invention, to prevent undesired bending or curling of the beams and to ensure that the beam array of the micro loading device 50 remains planar.

At room temperature, stresses develop in the beam structure 110 due to mismatches between the coefficients of thermal expansion of the materials used to fabricate the beam and due to the intrinsic strains of the layers (or films) 114, 116 and 118. In general, for SCREAM structures, the silicon dioxide 114, 116 and the aluminum 118 are under compression and the material of core 112 is in tension. As a result, when the beam is released from the substrate during the SCREAM process, the aluminum and silicon dioxide on the top of the core tend to stretch and to bend a cantilevered SCREAM beam downwardly. Similarly, the Al and $SiO_2$ in the overhang region 120 of the side walls tends to stretch, and this tends to bend the beam upwardly. The cross-sectional dimensions of the beam and its coatings and of the overhang are, therefore, carefully chosen so that the two effects cancel, so that the beam remains straight and the structures made of such beams are planar. In an experimental fabrication of the device of the invention, the cross sectional dimensions illustrated in FIG. 6 were selected so that the beam array making up instrument 50 was planar, as illustrated in FIGS. 4 and 5.

Figure 7:
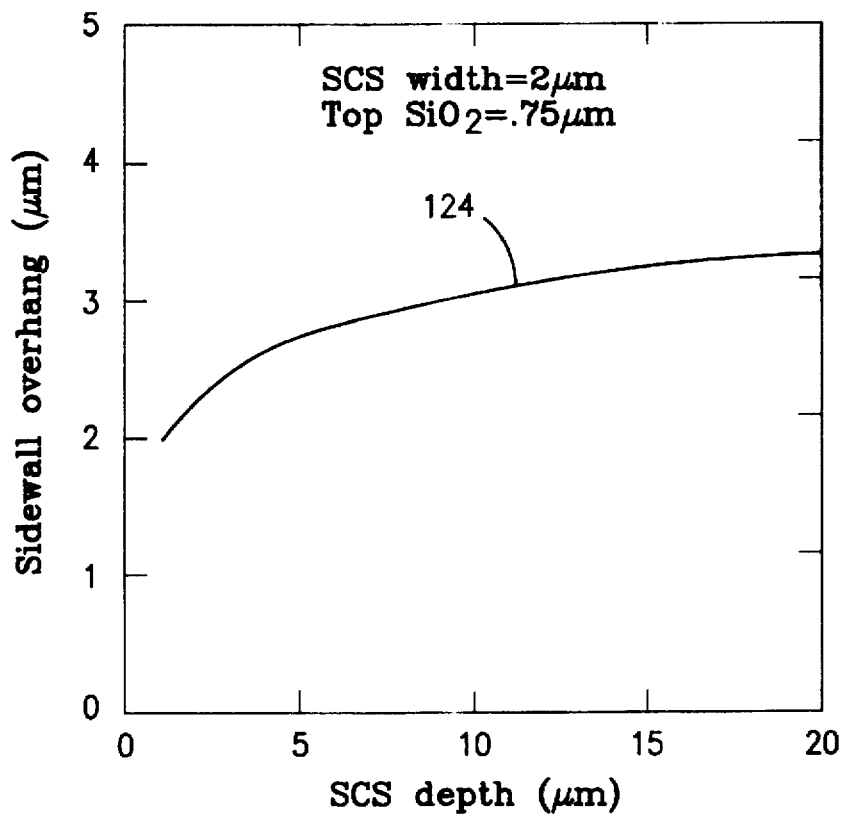
FIG. 7 is a design curve for planar SCREAM cantilever submicron beams prior to metallization.

The oxide layers 114, 116 may be deposited by PECVD at 300° C. However, the viscous flow temperature of silicon dioxide is 960° C. The aluminum layer 118 is sputtered, and the maximum temperature during sputtering may be around 45° C. This low deposition temperature and the mismatch of the coefficients of thermal expansion of the materials gives rise to the stresses described above, so that in general the silicon dioxide and aluminum layers are under compression and the single crystal silicon core is in tension. By careful analysis and measurement of these stresses, a design curve 124 (FIG. 7) may be derived for planar cantilever beams which have a single crystal silicon core 2 micrometers wide, with a 0.75 micrometer thick top oxide layer and a 0.25 micrometer thick side wall oxide. This curve was produced for a beam without an aluminum layer, since the stress in the aluminum can be relaxed by low temperature thermal cycling. This curve gives the required values of the side wall overhang and the height of the core that will result in a straight beam. The cross sectional dimensions of the beams the loading device illustrated in FIG. 6 closely match the required planarity conditions illustrated by curve 124.

The use of the microloading instrument of FIG. 2 is demonstrated by fabricating, as an integral part of the frame 56, a pair of test sample beams 130 and 132 (see FIG. 2). Beam 130 is integral with the frame at one end, while its opposite end is fixed to, and is integral with, a wall portion 134 of the substrate 78. Beam 132, which is parallel to beam 130, is also integral with the frame 56 at one end, but its other (outer) end 136 is free and is separated from wall 134 by about 0.5 micrometers. In one test of the present invention, each of the beams 130 and 132 were approximately 500 micrometers long with a cross section such as that illustrated in FIG. 6, and with the width of the beam core being 0.8 micrometers.

Figure 8:
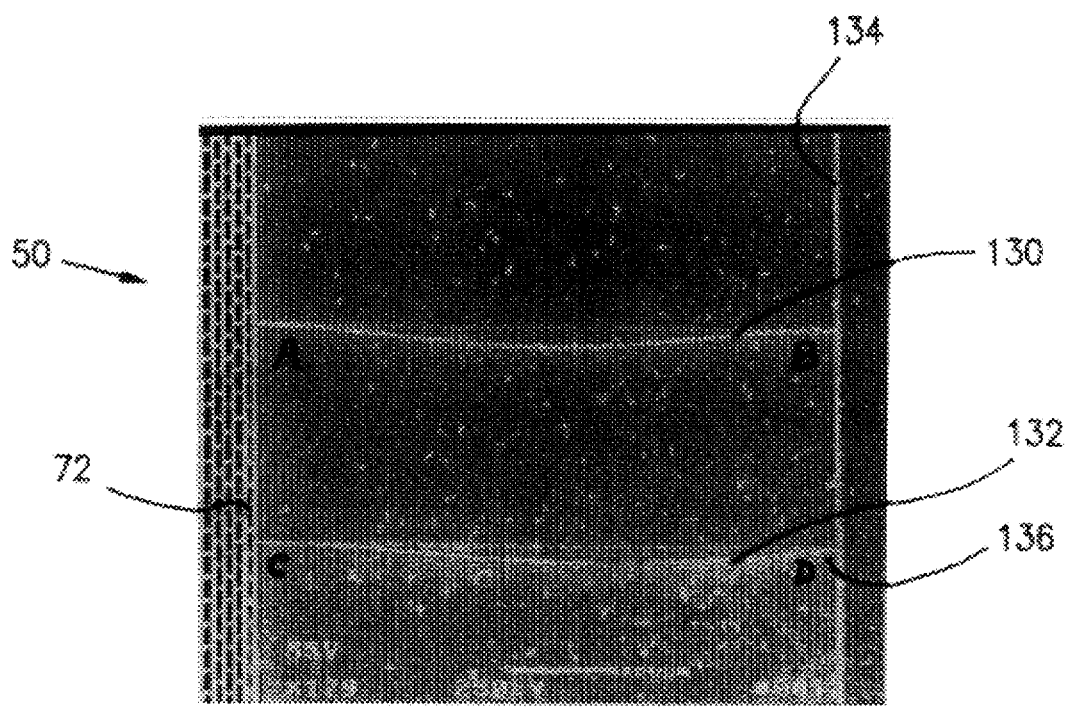
FIG. 8 is a photograph of a pair of MEM test beams buckled by the instrument of FIG. 2.
Figure 9:
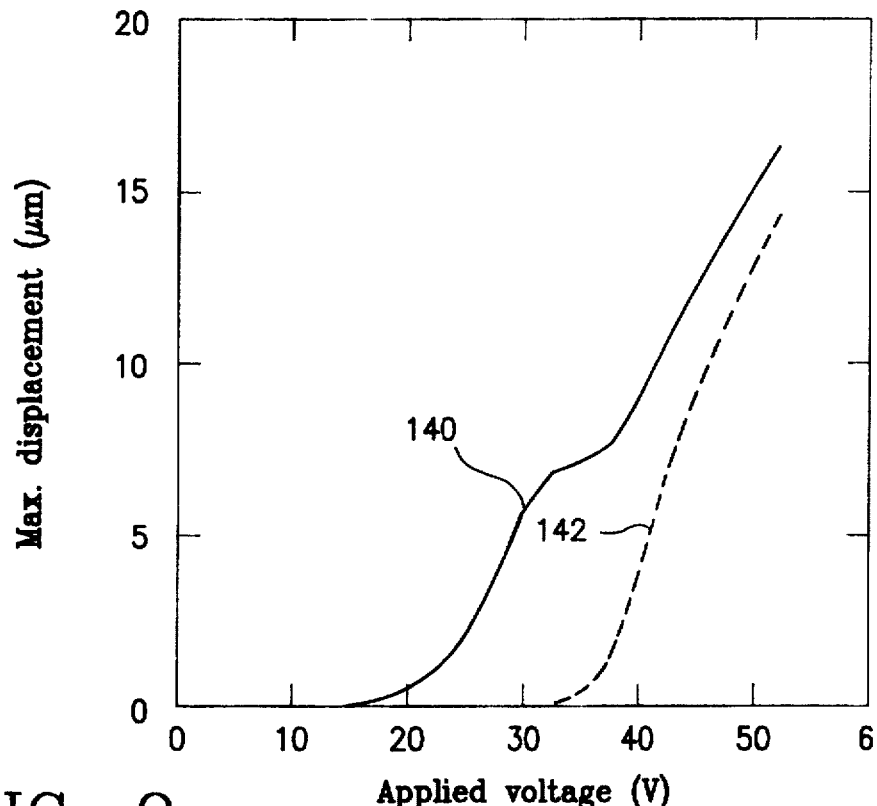
FIG. 9 is a graphical illustration of the transverse deformations of the beams of FIG. 8 with applied voltage.

In a test of the micro loading device of FIG. 2, 2000 of the 9000 comb elements in the instrument 50 were activated by a variable bias voltage applied between the fixed and movable elements to move the frame 56 in a direction to generate an axial compressive force on the beams 130 and 132. As the bias voltage was increased, the beam 130 gradually buckled to allow the beam 132 to approach the wall, touch it, be placed under compression, and finally to buckle. FIG. 8 illustrates the buckled shape of beams 130 and 132 when the bias voltage was 55 volts. As illustrated, beam 130 deformed with a zero slope at both ends, due to the fact that both ends were clamped. Beam 132 had a zero slope at its left hand end (as viewed in FIG. 8), where it was attached to the frame element 72, and formed an angle at its right-hand end 136 where it touched the wall 134. This contact with the wall behaves like a hinged connection between the beam and the wall. The maximum displacements of the beams occurring near their mid regions in directions transverse to their longitudinal axes with increasing and decreasing voltage were measured in the experiment, and the maximum transverse displacements with voltage are illustrated in FIG. 9 by curve 140 for beam 130 and by curve 142 for beam 132. As illustrated in FIG. 9, the beam 130 does not have any appreciable deformation until the application of a bias voltage of about 20 volts. Above 20 volts, this beam buckles, and is transversely displaced at almost a linear rate until the beam 132 touches the wall and starts sharing the compressive force. This occurs at about 30 volts. At this point, the deformation rate of beam 130 decreases until beam 132 also buckles, and then both the beams deform at a similar rate.

The foregoing experiment can also be used to calibrate the loading device 50 as described earlier. Calibration involves the evaluation of the spring constant K of the device and the constant $\beta$ which gives the force generated F from the known applied voltage $F=\beta V^2$. A long slender beam of length L and lowest flexural rigidity k buckles at a critical compressive load $P_{cr}=C\pi^2 k/L^2$. C=4 when the beam is fixed at both ends to produce a fixed-fixed beam and C≈2 when it is fixed at one end and hinged at the opposite end to produce a fixed-hinged beam. If the beams have slight imperfections, then they start to deform transversely at a load lower than $P_{cr}$, but the rate of deformation increases rapidly as the load approaches $P_{cr}$. After buckling, the beams 130 and 132 essentially carry the buckling loads. Thus, the force balance requires:

$$F=\beta V^2=K\delta+P_{cr\,130}+P_{cr\,132} \quad \text{(Eq. 18)}$$

where $\delta$ is the displacement of the loading device and hence the end displacement of the beam 130 along the axial direction. Rewriting the above equation:

$$\delta = \frac{\beta}{K} V^2 - \frac{P_{cr130}+P_{cr132}}{K} \quad \text{(Eq. 19)}$$

Figure 10:
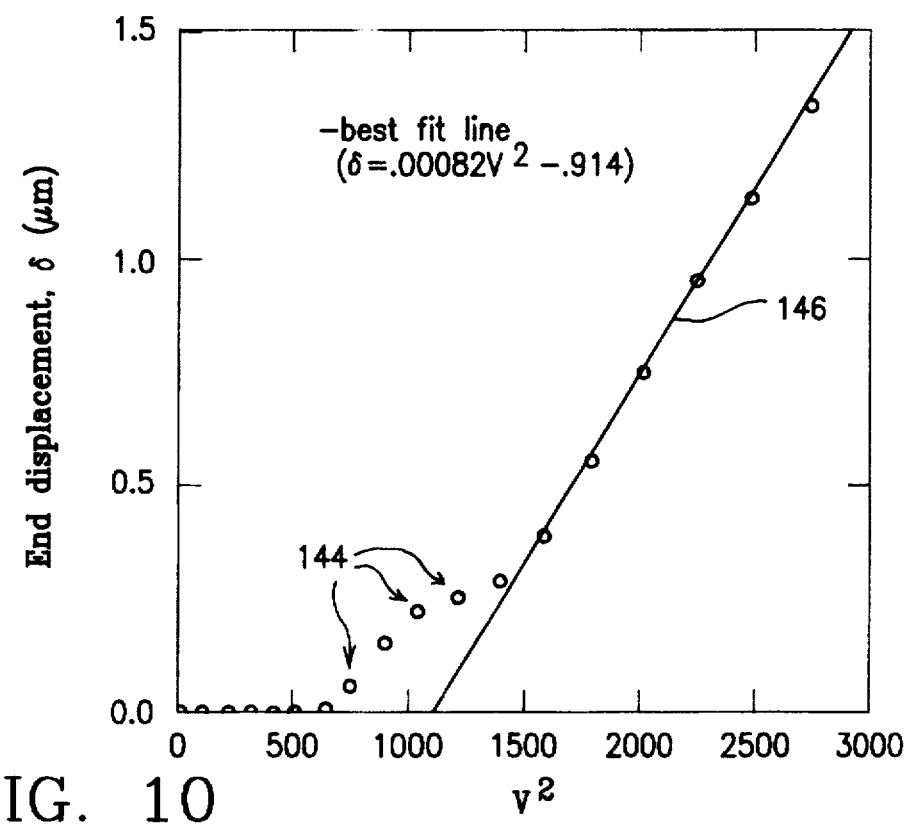
FIG. 10 is a graphical illustration of the variation of end displacements of the buckling beams of FIG. 8 with the square of the applied bias voltage V.

In the buckling experiment, the maximum transverse deformation D of the beam 130 was measured and is shown by curve 140 in FIG. 9. The value $\delta$ is then computed from D using equation $$\delta = \frac{\pi^2}{4} \frac{D^2}{L} \quad \text{(Eq. 20)}$$

which is valid for buckling of long slender beams clamped at both ends. As indicated by the plot 144 of $\delta$ versus $V^2$ shown in FIG. 10, there is linear variation of $\delta$ with $V^2$ after the beams 130 and 132 have buckled. The solid line 146 is the best fit straight line given by $$\delta=aV^2+b \quad \text{(Eq. 21)}$$

where a=0.00082 and b=0.914.

From equations 19 and 21, the following is obtained:

$$a=\frac{\beta}{K} \text{ and } b=-\frac{P_{cr130}+P_{cr132}}{K} \quad \text{(Eq. 22)}$$

Solving these equations gives $\beta=1.314\times10^{-7}$ F/m and K=160 N/m. Note that the design value for K=157 N/m. In this experiment, only 2000 combs out of 9000 combs of the device 50 were actuated. If all the combs are used, then $$\beta = \frac{9}{2} \times 1.314 \times 10^{-7} = 5.913 \times 10^{-7} F/m \quad \text{(Eq. 23)}$$

Figure 11:
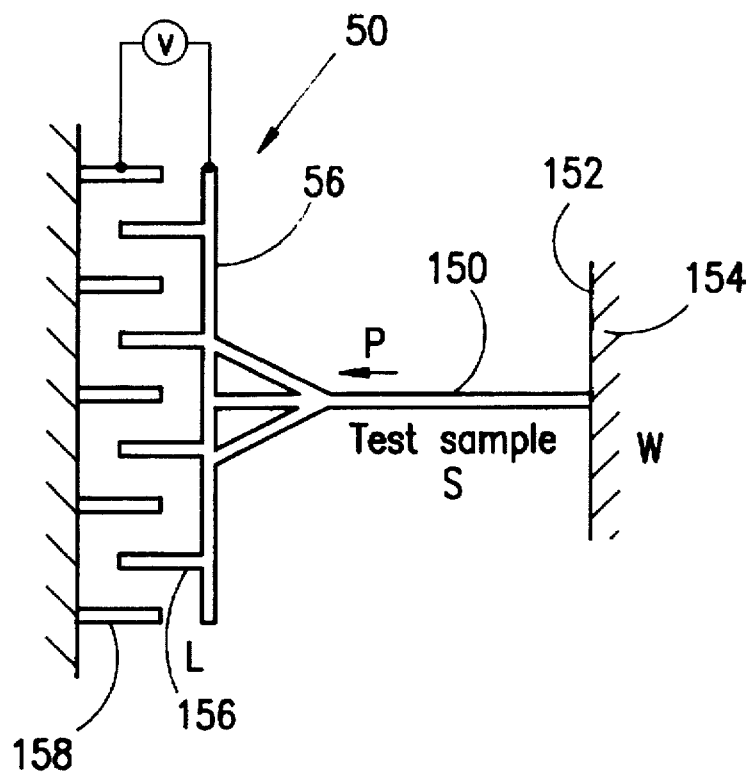
FIG. 11 is a diagrammatic illustration of the use of the instrument of FIG. 2 to test the tensile strength of a submicron test sample.
Figure 12:
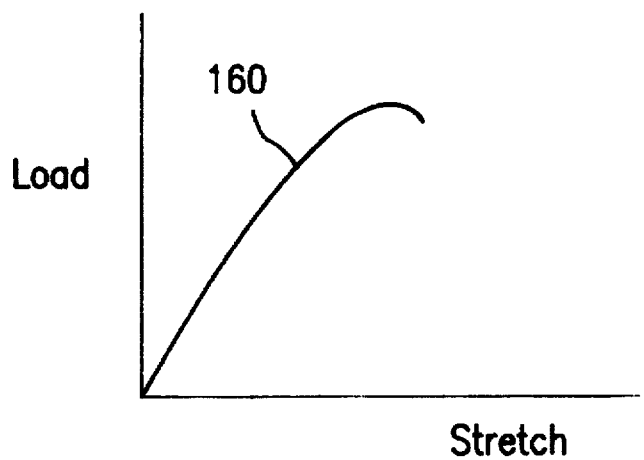
FIG. 12 illustrates a typical load versus stretching curve for a MEM beam under tension.

The loading instrument of FIG. 2 may also be used to determine the tensile strength of a test sample utilizing the test setup illustrated diagrammatically in FIG. 11. A test sample 150 may be a beam such as that described above fabricated as a part of the instrument 50 and being integral with the wall 152 of substrate 154. The sample is integral with the trunk portion 56 of instrument 50, which symbolically represents the entire loading device of the type shown in FIG. 2, with the comb capacitor elements for actuating the device being represented diagrammatically by the movable fingers 156 interleaved with stationary fingers 158. The comb capacitor generates sufficient force to stretch and eventually to break the sample 150 away from the wall 152, the force required being calculated from an estimate of the strength of the test sample. The loading device is activated by a bias voltage V applied across the interleaved comb fingers 156 and 158, with the stretching of the sample beam being measured by the total change of capacitance between the fingers. The applied force versus the stretching data is then measured until the test sample breaks, with FIG. 12 illustrating a typical load versus stretch curve 160.

Figure 13:
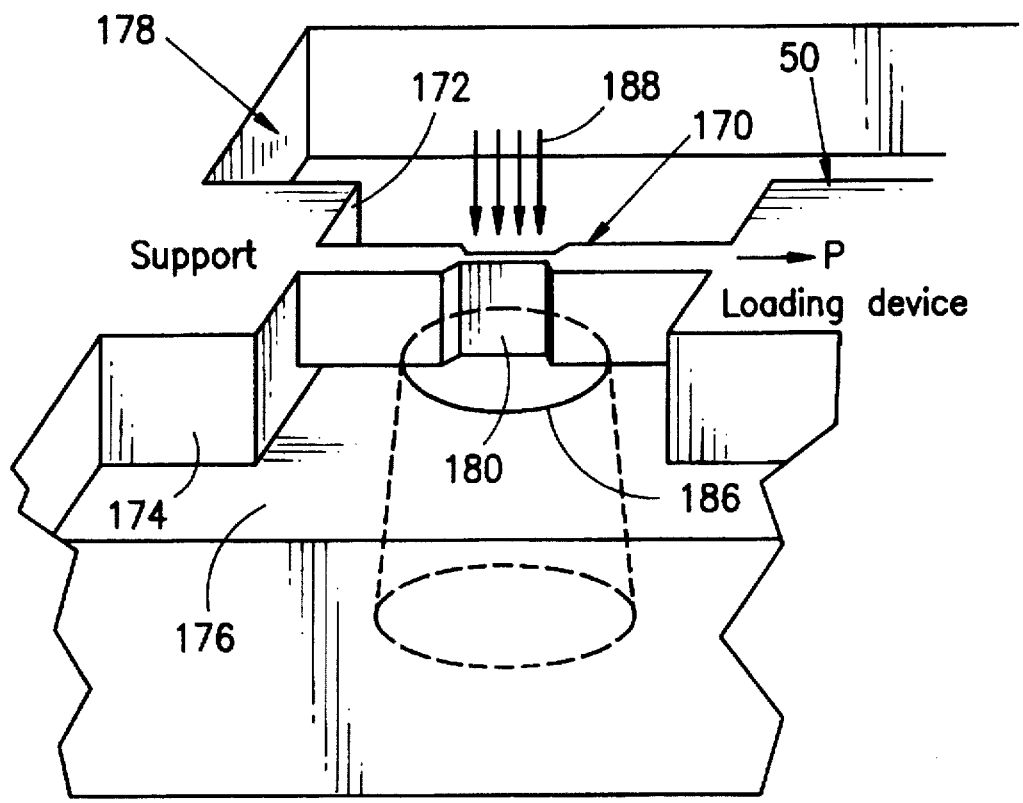
FIG. 13 illustrates the use of the loading instrument of FIG. 2 for tensioning a modified MEM test sample.

FIG. 13 illustrates in diagrammatic form a second test specimen 170 secured between and integral with a loading device such as the microloading instrument 50 of FIG. 2 and a support 172 such as the wall of a substrate 174. The specimen is released; that is, it extends above the floor 176 of a trench 178 formed in the substrate by the SCREAM process in the fabrication of microloading device 50. In similar manner, the loading device 50 is also released and extends above the floor 176, and is suspended by spring beams 80–89 which are integral with the cavity wall, as described with respect to FIG. 2.

Figure 14:
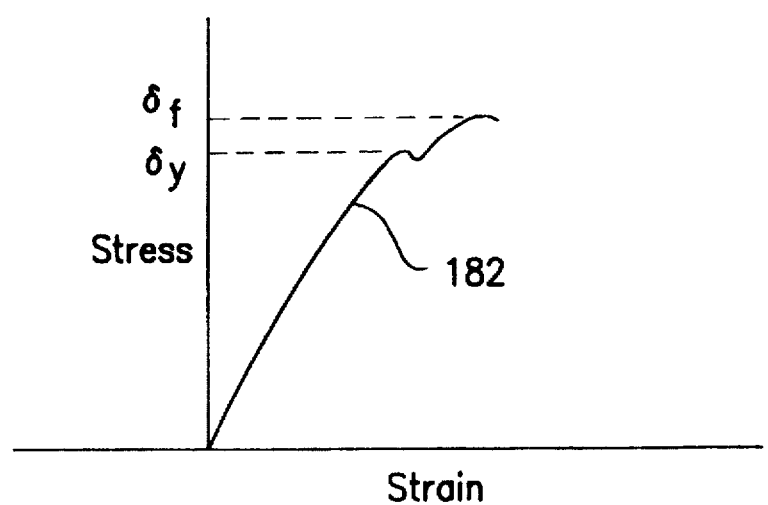
FIG. 14 illustrates the stress-strain relationship for the test sample of FIG. 13.

The test specimen 170 in FIG. 13 incorporates a region 180 of reduced cross section where the specimen is under the highest stress when a tensile force P is applied by energization of the loading device 50. The stress-strain relation of the material is obtained from measurements of the cross sectional area of the test sample, the applied load P, and the change of capacitance of the driving comb-type capacitors during loading. This relationship is illustrated in FIG. 14, where the stress $\sigma_y$ indicates the yield stress and $\sigma_f$ indicates the failure stress. As noted above, the loading device 50 may also be used to apply a compressive force (see FIG. 15) to sample 180 which would produce the curve 184 of FIG. 16 in the case where the sample compresses, but does not buckle under compressive load.

Figure 15:
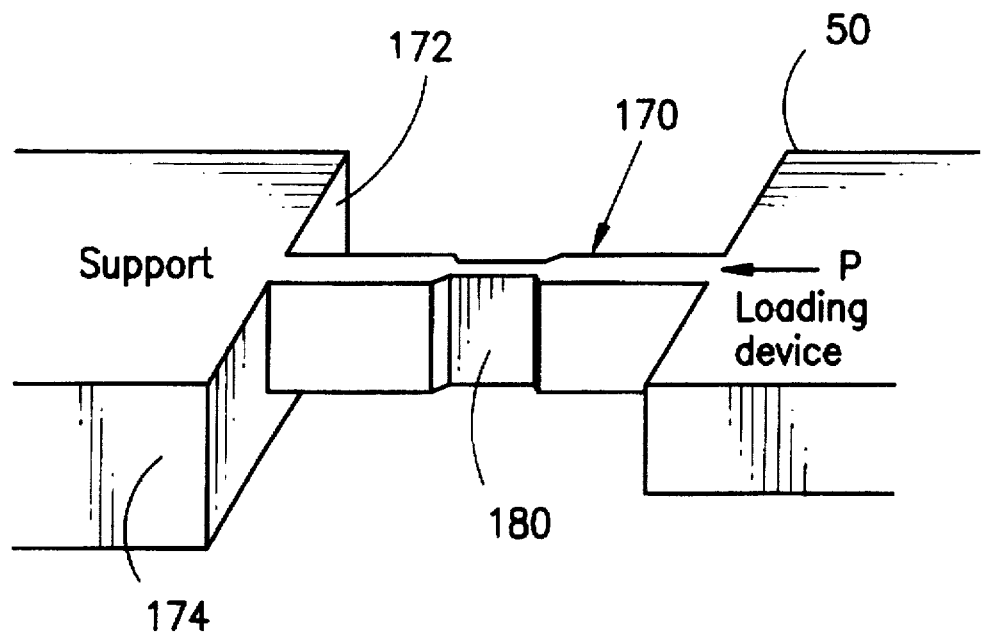
FIG. 15 illustrates the use of the loading instrument of FIG. 2 for compressing the modified test sample of FIG. 13.
Figure 16:
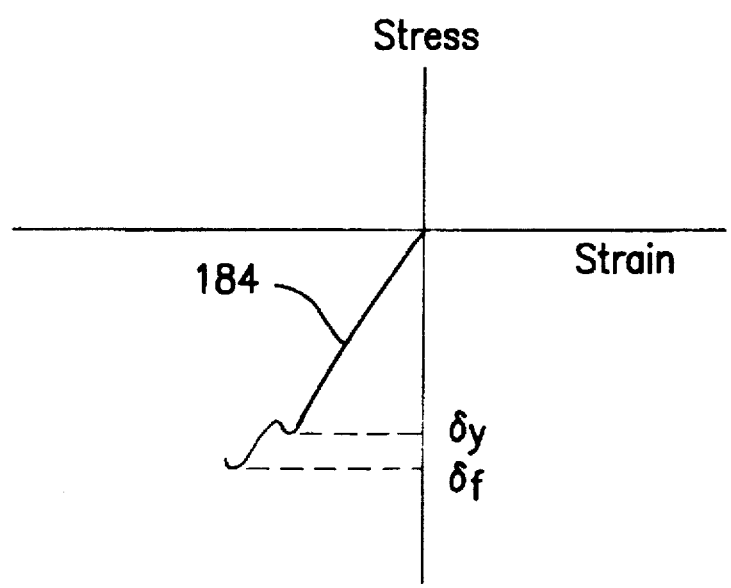
FIG. 16 illustrates the stress-strain relationship for the test sample of FIG. 15 under compression.

In FIGS. 13 and 15, the test sample, or a specific region of it, can be designed to be very thin and narrow, so that the cross-sectional area is on the order of $0.1 \times 0.1$ $\mu m^2$. Such a sample can be fabricated by repeated thinning of a larger sample by successive etching or chemical reactions, or fabricating samples from thin deposited film. Transmission electron microscopy can be performed on such samples during testing. In that case, a hole must be etched underneath the sample as indicated at 186 (FIG. 13) so that an electron beam 188 can penetrate through the sample and traverse through the hole in the substrate and be captured by a detector. TEM analysis will reveal the evolution of dislocations and other defects in the sample during testing prior to failure.

Figure 17:
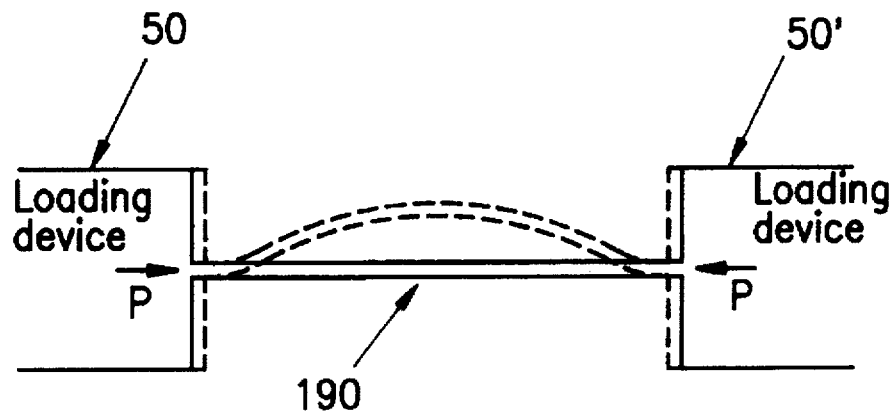
FIG. 17 illustrates a compression test utilizing two loading devices.
Figure 18:
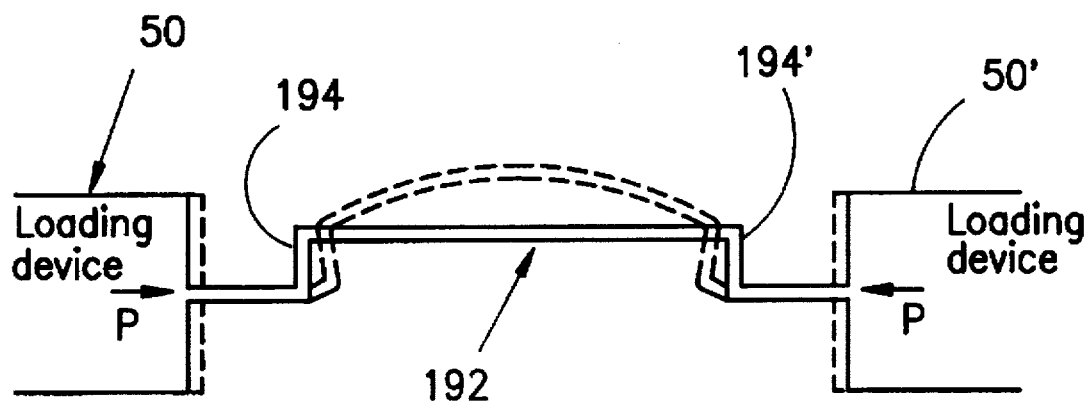
FIG. 18 illustrates a compression test on a MEM beam having a transverse step.

The force applied by the by the loading device of FIG. 15 can be increased to cause long slender beams to buckle under a compressive force, as discussed above, and as diagrammatically illustrated at 190 and 192 in FIGS. 17 and 18, respectively. In both of these cases, the loading device 50 of FIG. 2 is utilized to apply a compressive force to the beam. If desired, the fixed mounting of the beam on the substrate may be replaced by a connection to a second loading device 50'. With this latter arrangement, a compressive force is applied from both ends as illustrated. It will be understood that such a modification is available with each of the above-discussed test configurations. In the device of FIG. 18, the beam is fabricated with transverse steps or discontinuities 194, 194', which predispose the beam to buckle in the upward direction, as viewed in the figure.

Figure 19:
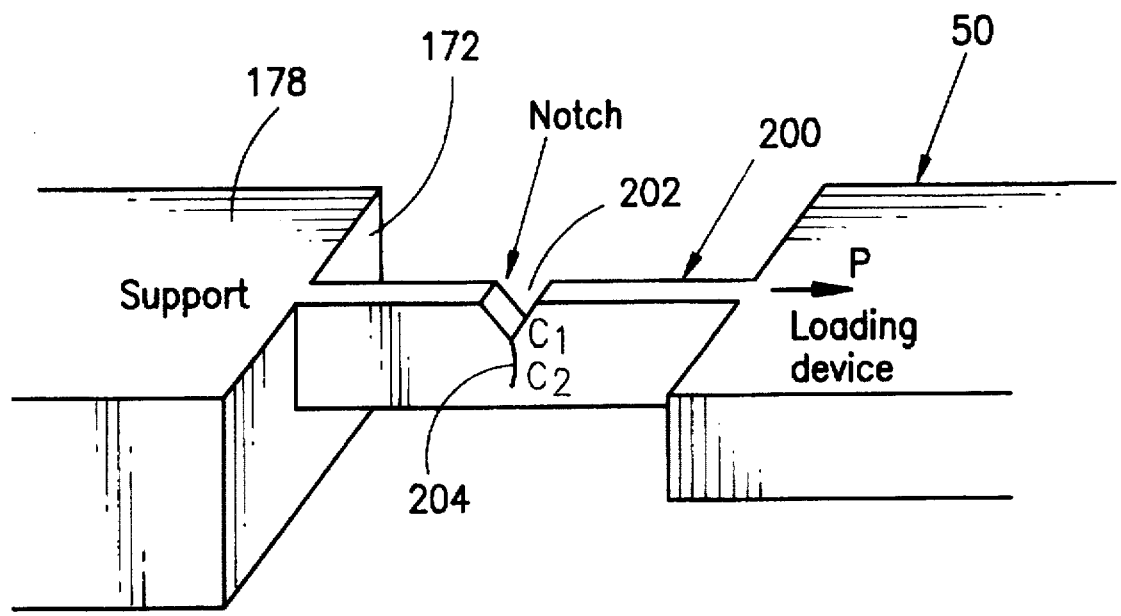
FIG. 19 illustrates a tensile fracture test on a MEM beam having a notch.

Another application of the device of FIG. 2 in testing samples is illustrated in FIG. 19 wherein a beam 200 is connected between a fixed wall 172 and a loading device such as device 50 of FIG. 2. In this embodiment, the test specimen incorporates a notch 202 which causes the beam to fracture under tension, presumably along a fracture line 204 extending from the base of notch 202 at $C_1$ to a second location in the beam indicated at $C_2$. The loading device may be used to study the energy required to produce and propagate such fractures in submicron-size materials, the data available from such testing being essential for the design of micromechanical systems resistant to cracking.

Figure 20:
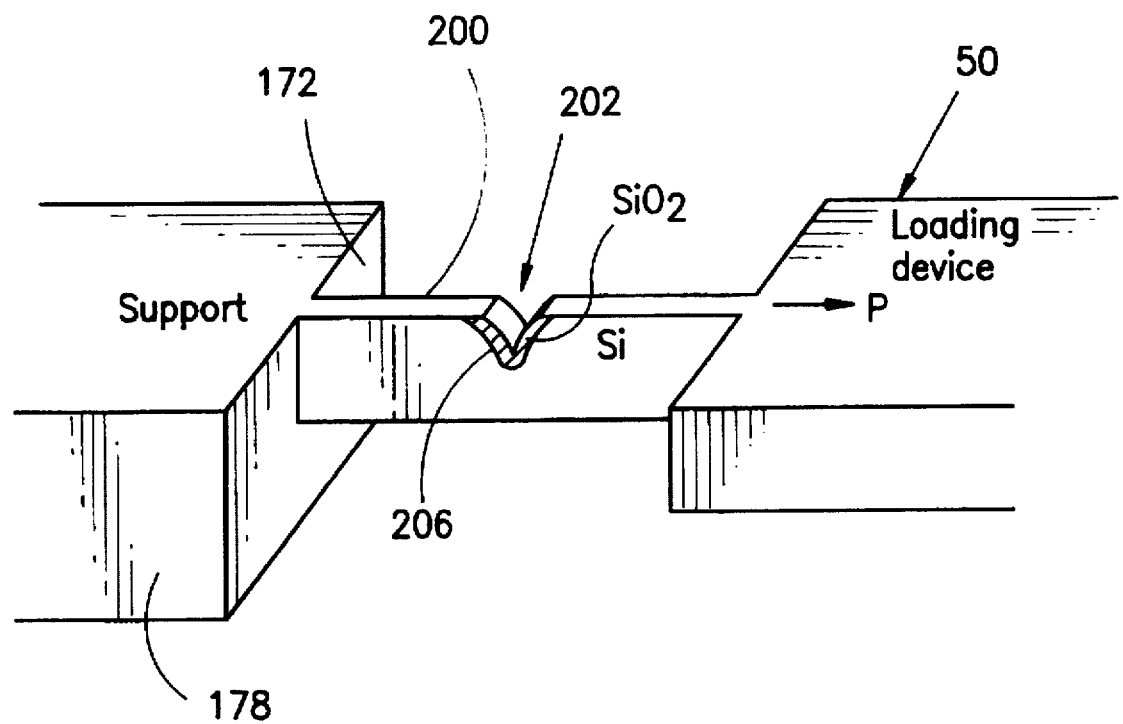
FIG. 20 illustrates the effect of oxidation on fractures in MEM beams.

Often in microelectronics, the silicon used for fabricating structures is partially oxidized. The oxide develops large stresses on microscopic notches that may develop due to the non-uniformity of surfaces as a result of processing. FIG. 20 illustrates the beam 200 having a notch 202 which has been oxidized locally at 206 to produce a silicon dioxide layer in the notch. The beam can then be placed under tension by the loading device 50 to propagate a fracture in the manner described with respect to FIG. 19. The difference in the force required to propagate the fracture from the notch 202 with and without the oxide determines the role of oxide in structural failures. Structures can then be designed on the basis of such data to prevent failure due to oxidation.

Figure 21:
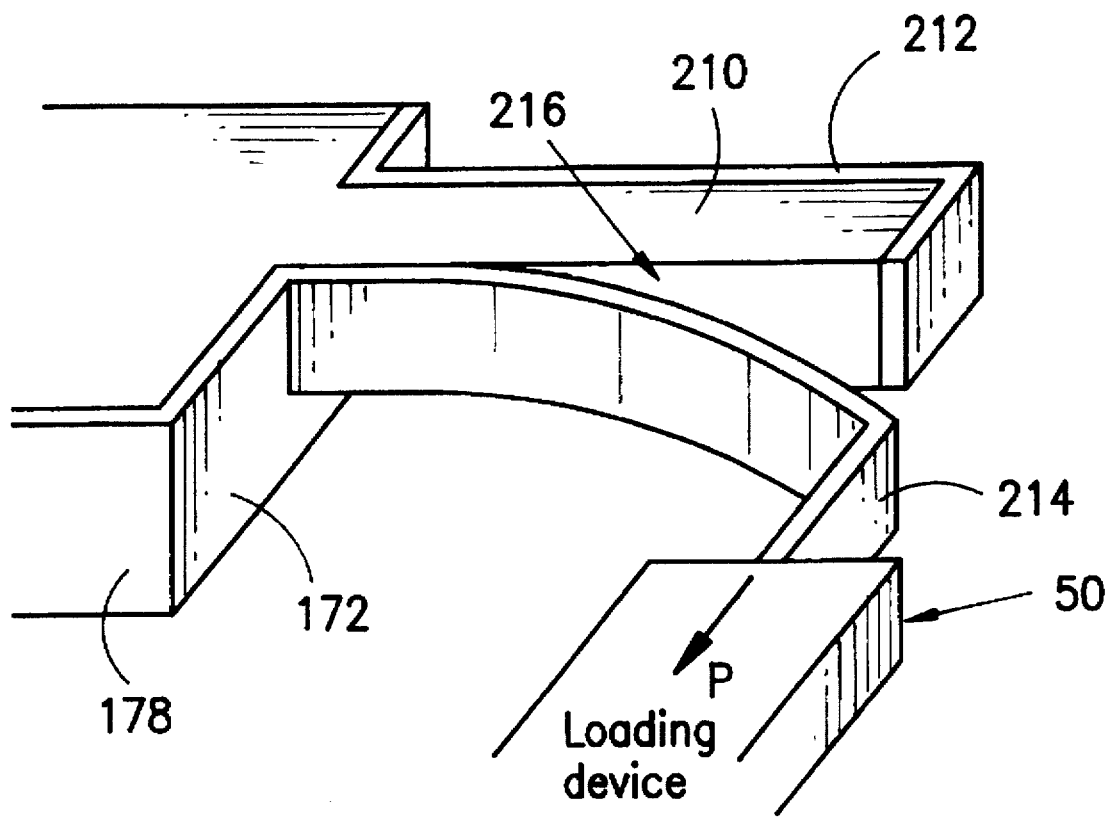
FIG. 21 illustrates a test setup for determining interface bond strength in MEM structures.

Micromechanical systems are often composite in nature; that is, the structural components are made of layers of materials bonded together. The integrated microloading instrument of the present invention can be used to determine the bond strength between materials in the manner illustrated in FIG. 21. As there illustrated, a cantilevered beam 210, which is integral with wall 172 of substrate 178, is covered by a layer 212 which is connected to the loading device 50, as by an integral arm portion 214. The loading device produces a tensile force P in a direction which tends to peel the layer 212 away from beam 210, as illustrated at 216, and the loading device 50 provides a measure of the energy required for this purpose. This energy is a measure of the bonding characteristics between the core material 210 and the layer 212.

Figure 22:
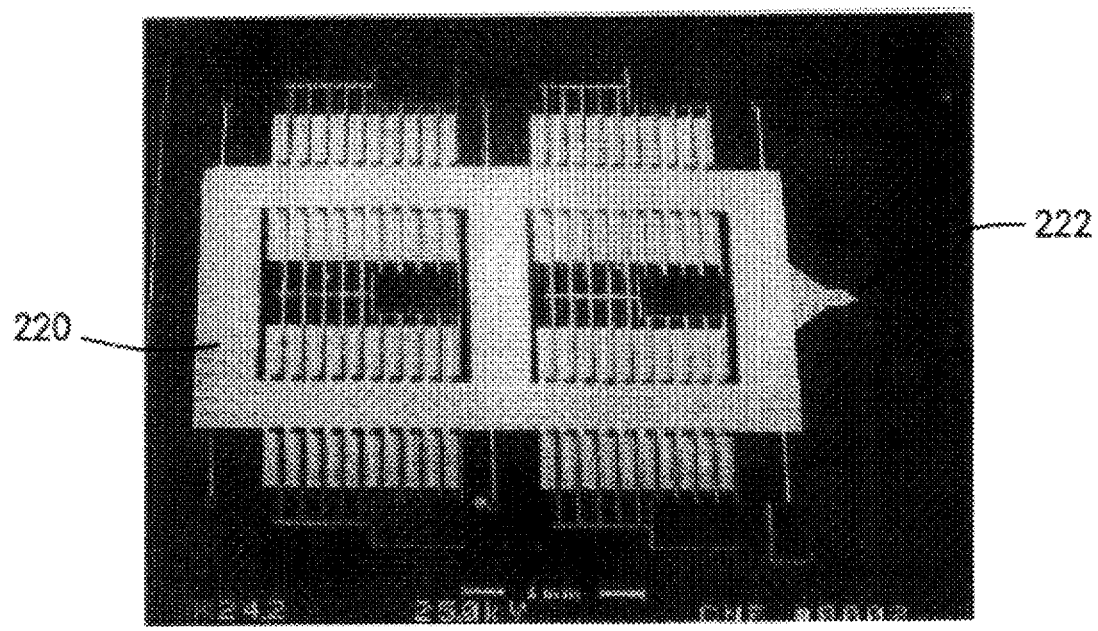
FIG. 22 is an enlarged photomicrograph of another microloading instrument, similar to the instrument of FIG. 2.
Figure 23:
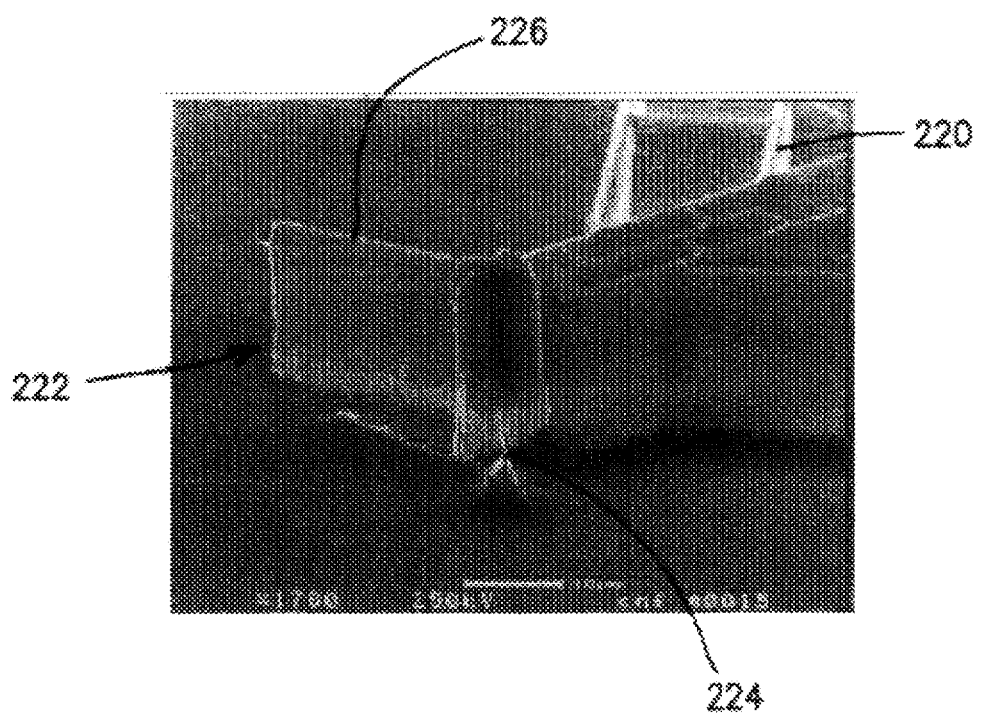
FIG. 23 is an enlarged photomicrograph of a test sample and attached lever arm fabricated with the instrument of FIG. 22.

Materials often fail by shear and bending stresses. FIG. 22 shows a smaller microloading instrument 220 that may be used to study failure by bonding and shear. The instrument applies force on a test sample 222 placed at its right-hand end. FIG. 23 shows an enlarged view of the sample 222 which includes a silicon pillar 224 which is 0.5 µ wide at the mid height. The pillar is attached to a stiff lever arm 226. The loading instrument 220 applies force on the lever arm which twists and bends the pillar until failure. From the rotation of the lever arm and bending of the pillar prior to failure, the stress to failure of the pillar can be determined.

Figure 24:
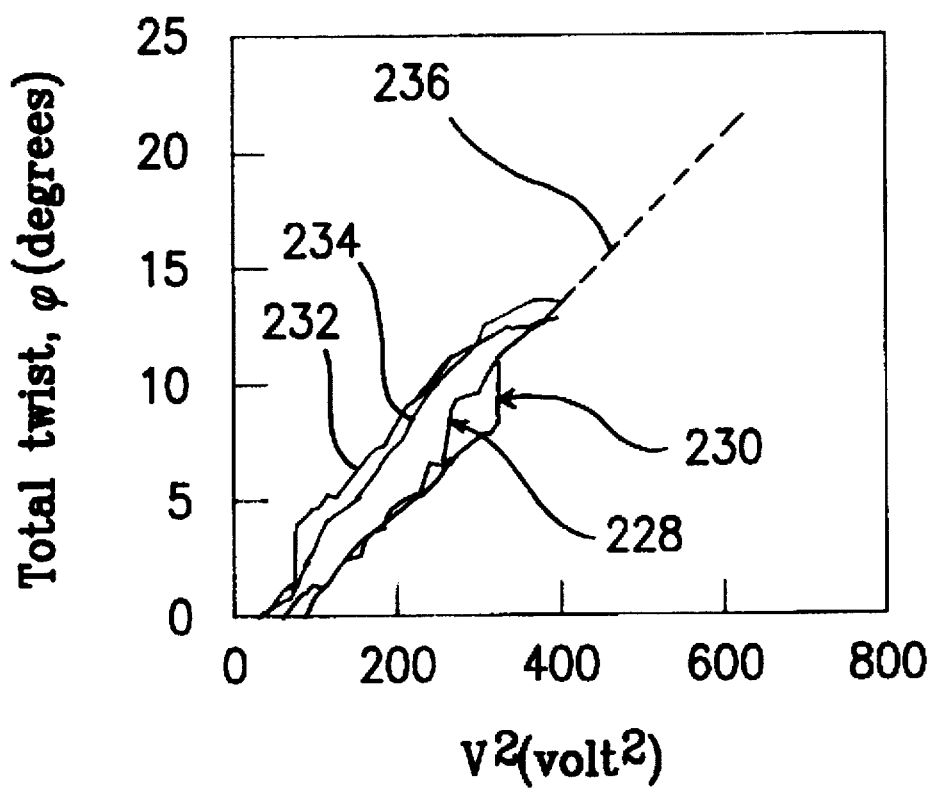
FIG. 24 is a graphical illustration of the rotation of the lever arm of FIG. 23 with the square of the voltage applied to the instrument of FIG. 22.

FIG. 24 illustrates the rotation of the lever arm as a function of applied voltage squared on the loading device 220. The two lower solid curves 228 and 230 are obtained during loading. The upper solid curves 232 and 234 are obtained during unloading. The dashed curve 236 is obtained during a third loading until the failure of the pillar.

Figure 25:
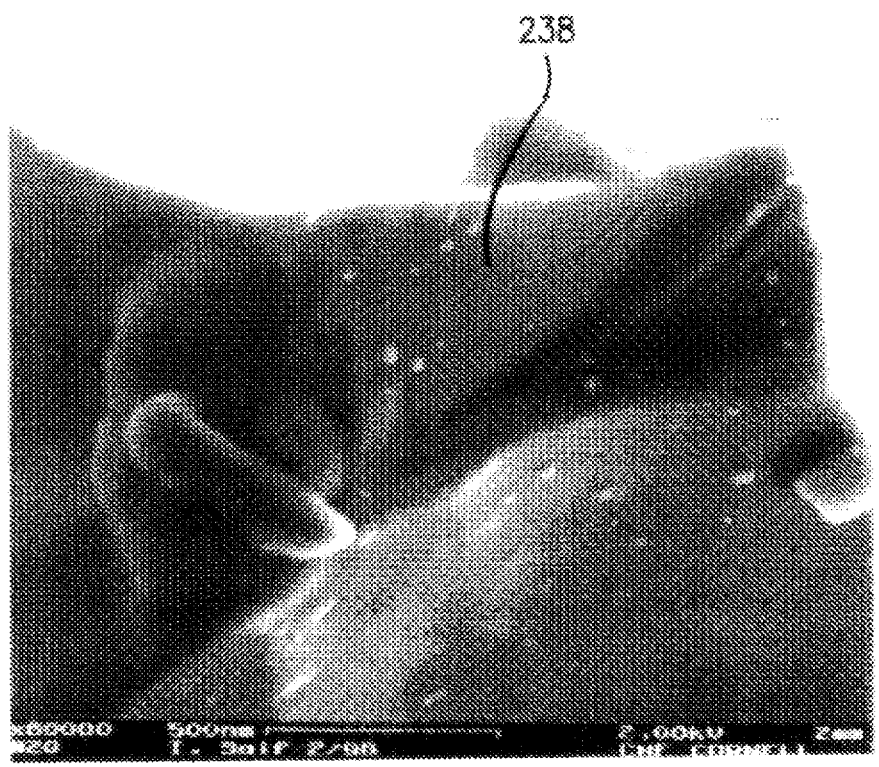
FIG. 25 is a photomicrograph of a fracture surface on the test sample of FIG. 23.

FIG. 25 shows the pillar 224 at a fracture surface 238. Preliminary studies on this experiment show that the maximum stress at which the pillar failed is 20 GPa normal tensile stress, or about two orders of magnitude higher than the failure stress of bulk single crystal silicon.

The above experiment can also be done with a transmission electron microscope to study the evolution of any dislocation or other damage during loading. The testing can also be done in conjunction with surface analysis devices such as Auger Electron Spectroscopy to study the surface of the fractured surface immediately after formation, while the loading instrument and the sample are still in an ultra high vacuum.

The above experiment can be repeated with very thin films on the surface of the pillar; for example, silicon dioxide or silicon nitride, to study the role of surface coatings on the failure mechanisms. Such films can be thinned or removed during testing by Auger electrons.

Figure 26:
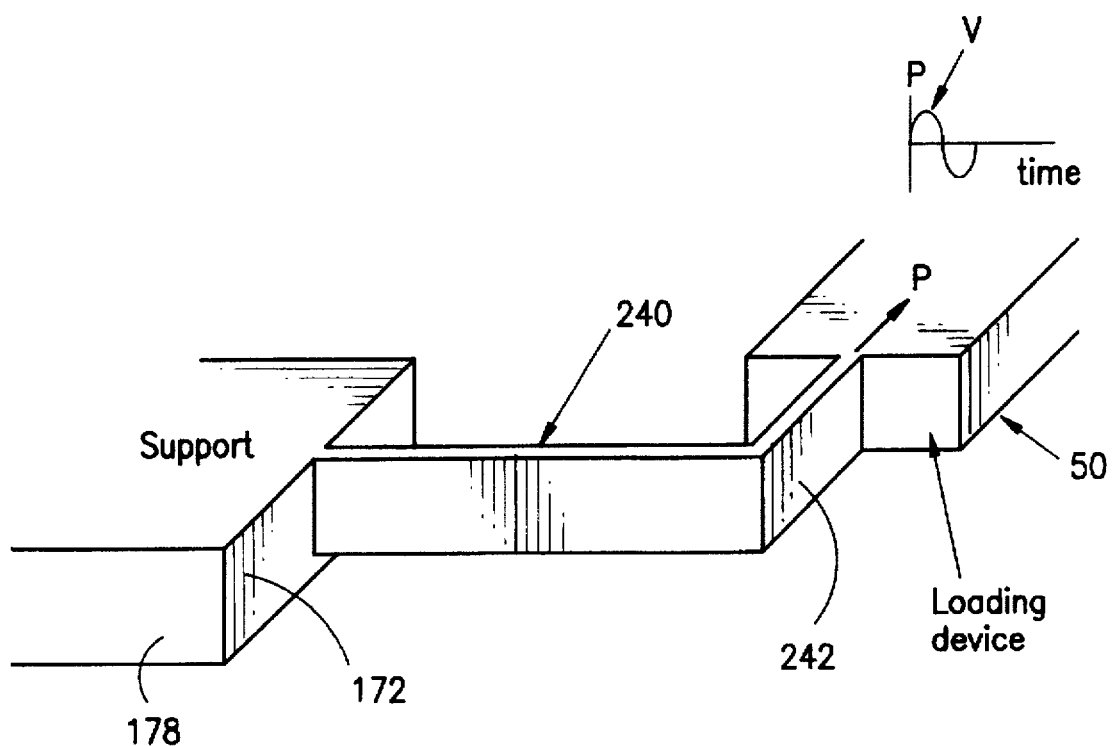
FIG. 26 illustrates a test setup for determining fatigue failure in MEM structures.

Microelectromechanical systems are often subjected to vibration and thus to cyclic loading. The failure of such structures due to fatigue and aging caused by such repeated loading can be evaluated by the test set up illustrated in FIG. 26. A cantilever beam 240 mounted on wall 172 of substrate 178 is connected by a transverse arm 242 to the loading device 50. Application of a cyclical voltage V to the loading device causes a cyclical variation in the force P applied through transverse arm 242 to the beam 240. This generates cyclic loading on the test beam 240, and the resonant frequency of the beam or the beam-loading system after a given number of cycles of loading will indicate any loss of stiffness in the beam and thus will indicate degradation of the beam due to fatigue or aging.

Figure 27:
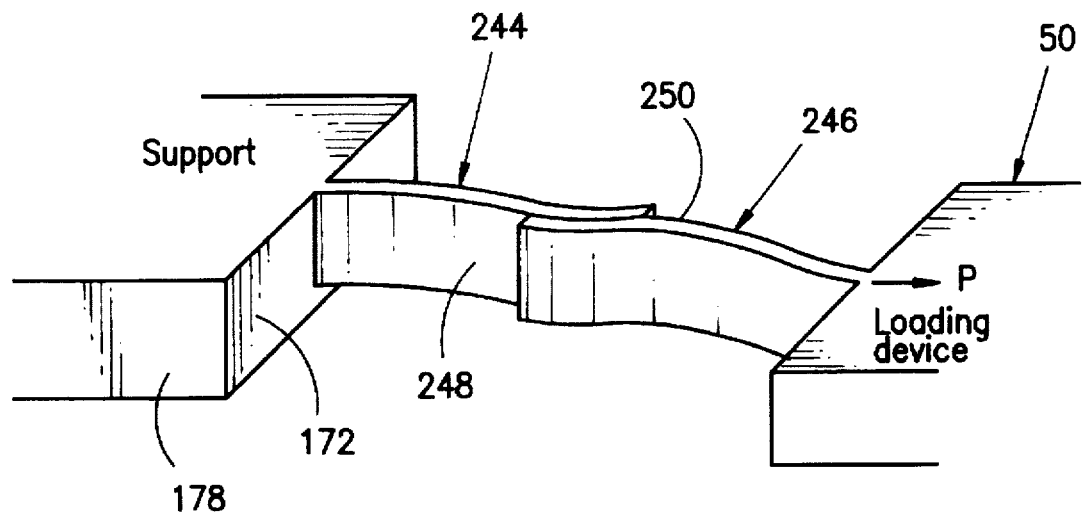
FIG. 27 illustrates a test setup for measuring the surface force between solids.

When two solid surfaces are brought in contact with each other, a solid-to-solid surface tension force develops between them. The magnitude of this force depends on several factors, including the types of solids and the degree of surface roughness. The force between two such surfaces can be evaluated by the scheme illustrated in FIG. 27 where an elongated flexible cantilevered beam 244 extends from a surface 172 on substrate 178. A second elongated flexible beam 246 is integral with the loading device so, with adjacent surfaces 248 and 250 of beams 244 and 246, respectively, being brought close to each other, as by a small lateral adjustment of the loading device 50 or by pressing the beams together by means of an actuator (not shown). Then, the loading device 50 applies a longitudinal force P which causes the surfaces 248 and 250 to slide along each other. The force required to cause such sliding motion can be related to the force of attraction between the surfaces.

A droplet of liquid between two solid surfaces forms a meniscus and generates force due to capillary effects. Such a force may destabilize micromechanical structures, as discussed above, and the test apparatus illustrated in FIG. 27 can be used to determine the magnitude of the capillary force between surfaces 248 and 250.

Figure 28:
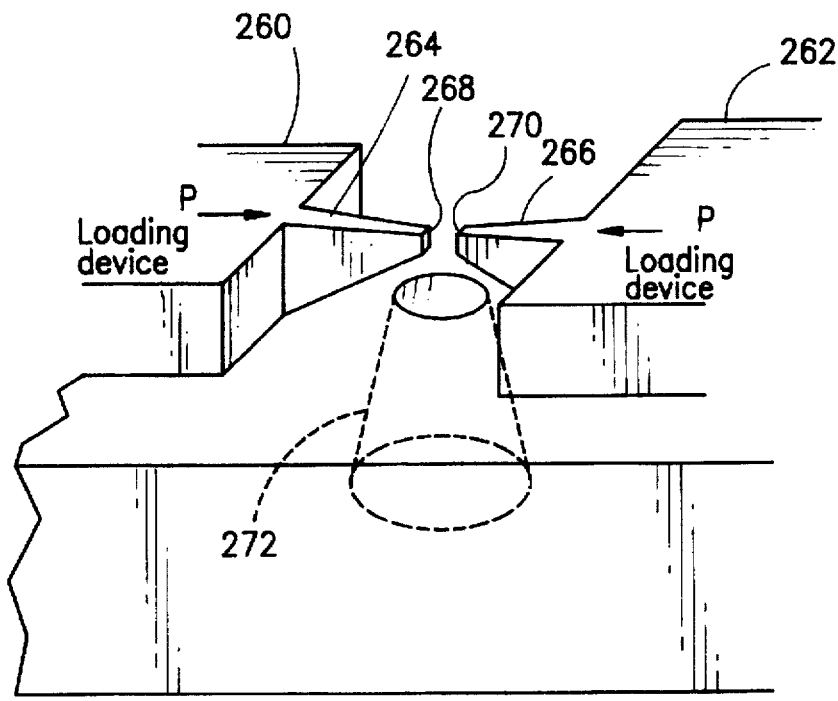
FIG. 28 illustrates a test setup for measuring ultra-high pressure in a MEM system.

The response of various materials under ultra high pressure can be studied by the arrangement illustrated in FIG. 28, wherein two loading devices, each similar to the loading device of FIG. 2, for example, are fabricated to incorporate corresponding sharp tips 264 and 266, respectively. The tips are fabricated to be integral with the trunk portions of the respective loading devices and are longitudinally aligned so that the ends 268 and 270, respectively, of the tips 264 and 266 can be brought together by activation of the loading devices with the tips in aligned end-to-end relationship. Further activation of the loading devices produces respective forces P to cause the tips to press on each other.

The tips 264 and 266 can be fabricated in accordance with the SCREAM process to have diameters at their end portions 268 and 270 on the order of 20 nanometer. When the loading devices generate a milliNewton force P, the pressure developed at the tips can be on the order of a terrapascal ($10^{12}$ pascal). The response of materials at ultra high pressures are of interest, for many materials possess unique properties such as phase changes at such pressures. Such an experiment can be carried out inside a Transmission Electron Microscope (TEM). In that case, the substrate must be removed underneath the high pressure testing region by fabricating a hole 272 as shown in FIG. 28. Phase transformation or other microstructural changes due to high pressure can be studied in-situ by transmission electrons.

Figure 29:
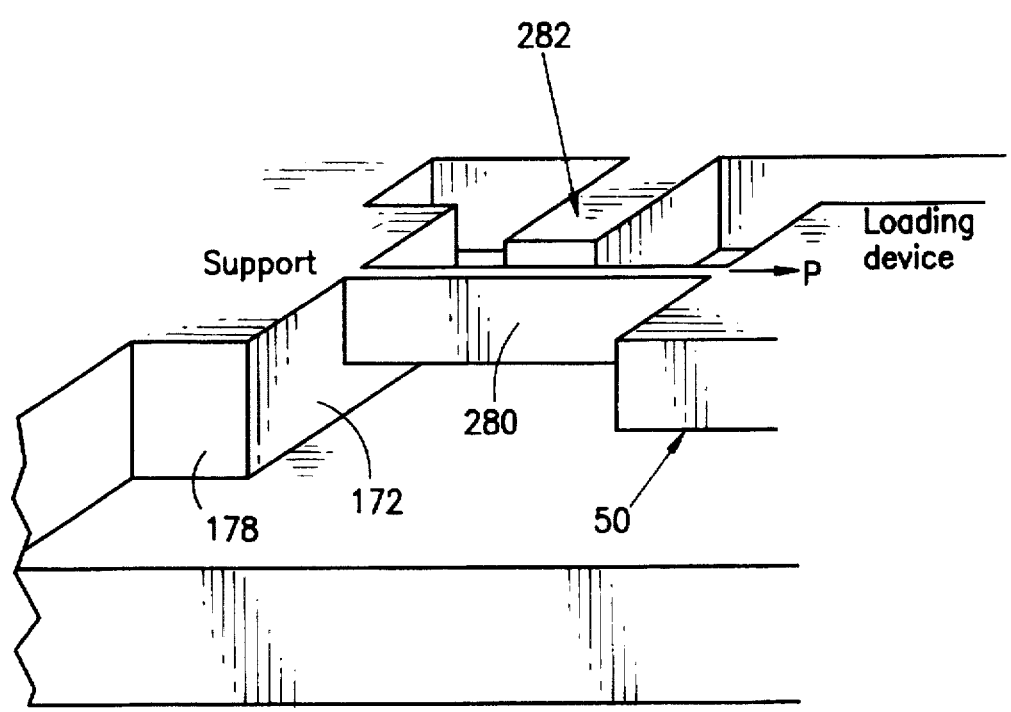
FIG. 29 illustrates a test setup for measuring dynamic properties of MEM structures.

The quality factor of structures subject to vibration is an important parameter, for it is an indicator of the energy consumed by the structure during oscillation. This factor may depend on the load applied to the structure, but in most applications a high quality factor is desired. FIG. 29 illustrates a test arrangement for measuring the quality factor of a vibrating beam 280 that is subject to varying degrees of tensile force applied by a loading device such as the micro loading instrument 50 of FIG. 2.

The beam 280 is connected at one end to the loading device 50 and at its opposite end to the wall 172 of a support substrate 178, the beam being released from the floor of a cavity in the substrate, as discussed above. The beam is similar to that described with respect to FIG. 6 in that it incorporates a single crystal silicon core, a silicon dioxide insulating layer, and an outermost aluminum layer. The aluminum layer may be connected to a suitable bias source to serve as one plate of a capacitor, with a second plate being fabricated at the same time on a stationary electrode 282 which may be cantilevered from a side wall of the cavity in which the beam is located or which may be free standing on the floor of the cavity. The electrode incorporates a metal coating and is connected to a voltage source so that a potential difference can be established between beam 280 and electrode 282. Application of an alternating voltage between the beam and the electrode produces alternating lateral motion in the beam 280.

As illustrated in FIG. 29, the resonant frequency of the vibration in a long, slender beam 280 which is supported at both ends can be increased by stretching the beam by means of a force P applied by activation of the loading device 50 in the manner described above. The higher the tensile force on the beam, the higher its resonant frequency, so by applying a varying amount of stretching force on the beam, its resonant frequency is varied significantly. This arrangement permits tuning of the a study of the resonant frequency of the beam 280, and hence a device attached to it.

Figure 30:
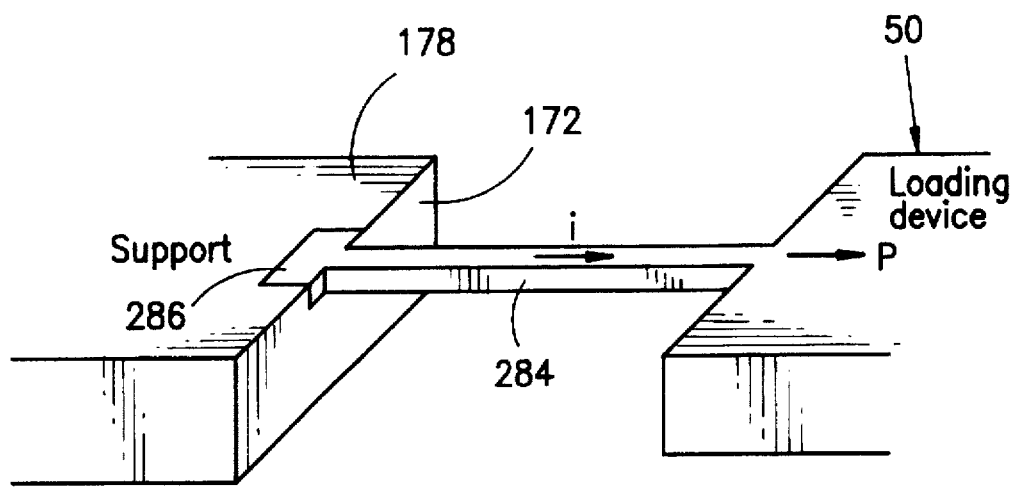
FIG. 30 illustrates a test setup for measuring changes in current flow with changes in tension in a MEM beam.

FIG. 30 illustrates a test setup similar to that of FIG. 29, wherein the long, slender beam 284 is connected between a fixed support such as the wall 172 of a substrate 178 and a loading device 50. In this case, a voltage is applied between the loading device and a contact pad 286 on the support 178 to cause a current i to flow through the single crystal silicon core of the beam 284 or through the metal layer on the beam. The loading device 50 may then be activated to apply a tensile force on beam 284 to permit determination of variations in electrical properties, such as resistance of the beam, under mechanical stress and various current flows. The energy bandgap of materials such as doped single crystal silicon change under stresses, and accordingly the device of FIG. 30 can also be employed to study changes in the bandgap of a test specimen under various stress conditions, in the manner described above.

The foregoing describes examples of test samples which were fabricated with the loading instrument. Such samples could be made of single crystal silicon, polysilicon, silicon dioxide, silicon nitride, various polymers, metals and similar materials extensively used in electronic industry. This cofabrication of test samples with the loading device is a unique advantage of material characterization with microloading instruments. However, it does not prevent testing of material specimens that cannot be cofabricated with the micro instrument. In such a case, specimens fabricated externally are moved to the testing region by micro-probes or other micromanipulating instruments. In certain situations where the samples are slightly charged, the sample might be moved simply by applying voltages on specific electrodes near the testing region.

Figure 31:
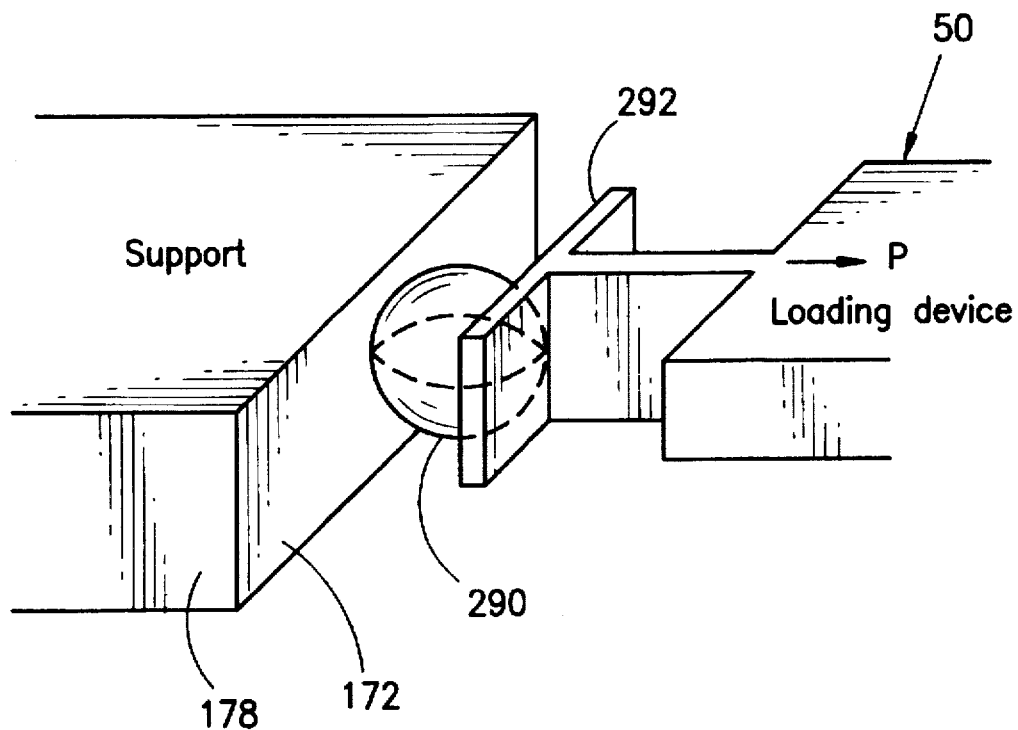
FIG. 31 illustrates a test device for samples which are not cofabricated with the test instrument.

An example is shown in FIG. 31. There, a small polymer sphere 290 is tested under compression between the wall 172 of a fixed support 178 and a movable actuator 292 connected to a loading device 50. Such particles are used extensively in paints and various other coatings. In the experiment of FIG. 31, the load versus the contact area of the sphere 280 with the contact surface 172 can be determined, both during loading and unloading. This is of interest, because similar forces develop between particles when they coalesce with each other after they are applied on surfaces and the liquid in which they survive dries out (such as paints).

All of the foregoing measurements and tests can be carried out under a wide range of environmental conditions, including very low or very high temperatures, high vacuum or high pressure, and various humidity conditions. In accordance with the invention, the testing instrument and the test sample or a test device are integrated by designing, patterning and fabricating them all together on the same substrate. Although the SCREAM process of fabrication has been illustrated in the present application, the integration of the test instrument and test sample is not limited to any particular fabrication technique. The instrument is an actuator that generates force by means of a comb, or parallel plate, capacitors which have a small size, low thermal mass, are vacuum compatible, and have built-in vibration isolation. Thus, the system of a loading instrument and a test sample can be mounted on a microscopic analytical instrument, such as a Transmission Electron Microscope for in-situ microstructural studies of materials while the loading device is testing the sample. The integration of the instrument and sample eliminates the problem of attaching and aligning the sample with the actuator and allows material and device characterization over a wide range of environmental conditions. Furthermore, the integration of the buckling beams with the loading device to calibrate it results in a truly integrated complete system. If the sample cannot be fabricated with the device and is fabricated separately, then testing can still be carried out by placing and aligning the sample using microprobes.

The design of the micro loading device provides a wide range of control of the force applied to test samples, and a wide assortment of test samples can be tested by the present arrangement. Thus, although the present invention has been described in terms of preferred embodiments, it will be apparent to those of skill in the art that numerous variations and modifications may be made without departing from the true spirit and scope thereof, as set forth in the following claims.

What is claimed is:

1. A microelectromechanical structure comprising:

an elongated beam structure having a single crystal silicon core with a generally rectangular cross-section and having a width in the range of 0.2–5 µm and a height in the range of 2–100 µm, said core having a top wall and a bottom wall defining the width of said core and opposed side walls defining the height of said core, the height of said core being greater than the width of said core to provide a high aspect ratio for said core;

a dielectric layer of silicon dioxide having a thickness of about 0.25 µm on said side walls of said core and a dielectric layer of silicon dioxide on said top wall having a thickness greater than said side wall dielectric layer thickness;

a metal layer of aluminum having a thickness of about 0.25 µm on said dielectric layer, the dielectric and metal layers on said top wall tending to bend said elongated beam in a downward direction;

said dielectric and metal layer on the side walls of said core extending below said core bottom wall to produce an overhang on each side wall, the overhang tending to bend said elongated beam in an upward direction, wherein the length of said overhang below said core bottom wall is greater than the combined thickness of said top wall dielectric and said metal layer to produce an amount of upward bending which cancels the downward bending produced by said top wall layers to produce a resultant planar beam structure.

2. The structure of claim 1, wherein said top wall dielectric thickness is between about 0.5 and 2.0 µm.

3. The structure of claim 2, wherein said elongated beam structure further comprises:

a trunk portion having a longitudinal axis and spaced elongated trunk sections parallel to said axis and interconnected by spaced transverse trunk sections;

plural spring sections suspending said trunk portion for axial motion with respect to a substrate;

multiple cantilevered wing sections extending transversely from said elongated trunk sections and movable therewith; and multiple combs having movable and fixed segments, said movable segments being mounted on said wing sections and movable therewith and said fixed segments being mounted on said substrate, each movable comb segment including multiple first fingers extending generally parallel to said axis and each fixed comb segment including multiple second fingers extending generally parallel to said axis and interleaved with said first fingers, said fixed and movable fingers comprising opposed capacitor plates energizable to shift said movable fingers axially with respect to said fixed fingers to shift said trunk portion along said axis.

4. The structure of claim 3, wherein each of said elongated trunk sections and each of said transverse trunk sections is comprised of a multiplicity of parallel beams interconnected by multiple cross beams to provide a stiff, planar trunk portion.

5. The structure of claim 4, wherein said spring sections are fabricated integrally with said elongated trunk sections, and each spring section is comprised of a plurality of parallel beams interconnected by multiple cross beams.

6. The structure of claim 3, further including a variable voltage source connected between selected fixed and movable fingers to energize said opposed capacitor plates and to produce a resultant force to shift said trunk portion.

7. The structure of claim 6, further including a sample connected axially between said trunk portion and said substrate, whereby said resultant force is applied to said sample.

8. The structure of claim 7, wherein said sample is constructed so that said resultant force is a compressive force on said sample.

9. The structure of claim 7, wherein said sample is constructed so that said resultant force is a tensile force on said sample.

10. The structure of claim 7, further including means for vibrating said sample while applying said force thereto.

11. The structure of claim 7, wherein said sample is integral with said trunk portion.

12. The structure of claim 7, wherein said trunk portion is located within a cavity in said substrate and is released from the substrate for motion.

* * * * *